United States Patent
Wu et al.

(10) Patent No.: US 9,859,875 B2
(45) Date of Patent: Jan. 2, 2018

(54) LATCH AND FREQUENCY DIVIDER

(71) Applicant: Spreadtrum Communications (Shanghai) Co., Ltd., Zhangjiang, Shanghai (CN)

(72) Inventors: Yiqiang Wu, Shanghai (CN); Jiewei Lai, Shanghai (CN)

(73) Assignee: SPREADTRUM COMMUNICATIONS (SHANGHAI) CO., LTD., Shanghai (CN)

( * ) Notice: Subject to any disclaimer, the term of this patent is extended or adjusted under 35 U.S.C. 154(b) by 261 days.

(21) Appl. No.: 14/877,267

(22) Filed: Oct. 7, 2015

(65) Prior Publication Data

US 2016/0352313 A1 Dec. 1, 2016

(30) Foreign Application Priority Data

May 29, 2015 (CN) .......................... 2015 1 0289334

(51) Int. Cl.
*H03K 3/356* (2006.01)
*H03K 3/012* (2006.01)

(52) U.S. Cl.
CPC ....... *H03K 3/356121* (2013.01); *H03K 3/012* (2013.01)

(58) Field of Classification Search
CPC ....... H03K 3/012; H03K 3/356017–3/356043; H03K 3/356113–3/356139
See application file for complete search history.

(56) References Cited

U.S. PATENT DOCUMENTS 5,945,858 A * 8/1999 Sato ................. H03K 3/356113
   327/115
9,473,119 B2 * 10/2016 Wu ......................... H03K 3/356
9,473,126 B2 * 10/2016 Wu ........................... H03K 5/04

* cited by examiner

*Primary Examiner* — Patrick O'Neill
(74) *Attorney, Agent, or Firm* — Cantor Colburn LLP

(57) ABSTRACT

A latch and a frequency divider are provided. The latch includes: a first logic unit coupled between a power supply and a ground wire, wherein the first logic unit includes a first input terminal and a first output terminal; a second logic unit having a structure symmetrical to that of the first logic unit, wherein the second logic unit includes a second input terminal and a second output terminal; and a first feedforward control unit adapted for cutting off a first current path, wherein the first feedforward control unit includes a first clock signal input terminal adapted for receiving a first clock signal, a third output terminal coupled to the first output terminal, and at least two feedforward control terminals, at least one of which is coupled to the first input terminal or the second input terminal. Power consumption of the latch and the frequency divider can be reduced.

24 Claims, 12 Drawing Sheets

LATCH AND FREQUENCY DIVIDER

CROSS-REFERENCE TO RELATED APPLICATIONS

The present invention claims priority under 35 U.S.C. §119 to Chinese Application No. 201510289334.X, filed on May 29, 2015, the entire content of which is incorporated herein by reference.

TECHNICAL FIELD

The present disclosure generally relates to digit circuit technology, and more particularly, to a latch and a frequency divider.

BACKGROUND

With development of communication technology, how to improve speed of RF circuits in a mobile communication terminal and reduce power consumption of the RF circuits has become a hot topic in modern mobile communication technology.

A divide-by-two frequency divider, as a basic module for a frequency divider circuit, is one of the key circuits in a RF circuit. A conventional divide-by-two frequency divider consists of two latch circuits, and each latch servers as a post-stage unit of the other latch. In conventional high speed divide-by-two frequency dividers, Razavi-structured divide-by-two frequency dividers have been widely used attribute to their outstanding performance such as high speed and low power consumption.

However, in the conventional Razavi-structured divide-by-two frequency divider, a current path will be formed between the power supply and the ground wire in both static working mode and dynamic working mode. Accordingly, the latch in the conventional high speed frequency divider has a shortcoming of high power consumption.

SUMMARY

The present disclosure aims to reduce power consumption of one or more latches in a Razavi-structured divide-by-two frequency divider.

In order to solve the above problems, a latch is provided in embodiments of the present disclosure. In one embodiment, the latch includes:

a first logic unit coupled between a power supply and a ground wire, wherein the first logic unit includes a first input terminal and a first output terminal;

a second logic unit having a structure symmetrical to that of the first logic unit, wherein the second logic unit includes a second input terminal and a second output terminal; and a first feedforward control unit adapted for cutting off a first current path between the power supply and the ground wire, wherein the first feedforward control unit includes:
a first clock signal input terminal adapted for receiving a first clock signal,
a third output terminal coupled to the first output terminal, and
at least two feedforward control terminals, at least one of which is coupled to the first input terminal or the second input terminal.

In some embodiments, the latch further includes: a second feedforward control unit adapted for cutting off a second current path between the power supply and the ground wire, where the second current path is different from the first current path, wherein the second feedforward control unit includes:
a second clock signal input terminal adapted for receiving a second clock signal;
a fourth output terminal coupled to the second output terminal; and
at least two feedforward control terminals, at least one of which is coupled to the second input terminal or the first input terminal.

In some embodiments, the first logic unit includes a third transistor and a fifth transistor, and the second logic unit includes a fourth transistor and a sixth transistor, wherein for the third transistor, a drain is coupled to the first output terminal, a source is coupled to the ground wire, and a gate is coupled to the second output terminal;

for the fifth transistor, a drain is coupled to the first output terminal, a source is coupled to the ground wire, and a gate is coupled to the first input terminal;

for the fourth transistor, a drain is coupled to the second output terminal, a source is coupled to the ground wire, and a gate is coupled to the first output terminal; and for the sixth transistor, a drain is coupled to the second output terminal, a source is coupled to the ground wire, and a gate is coupled to the second input terminal.

In some embodiments, the first feedforward control unit includes a first feedforward control terminal, a second feedforward control terminal, a first transistor, a seventh transistor and a ninth transistor, and the first transistor is coupled to the seventh transistor and the ninth transistor.

In some embodiments, the first transistor is a PMOS transistor, a source of the first transistor is coupled to a drain of the seventh transistor, a drain of the first transistor is coupled a source of the ninth transistor, and a gate of the first transistor serves as the first clock signal input terminal;

the seventh transistor is a PMOS transistor, a source of the seventh transistor is coupled to the power supply, and a gate of the seventh transistor serves as the first feedforward control terminal; and the ninth transistor is a PMOS transistor, a gate of the ninth transistor serves as the second feedforward control terminal, a drain of the ninth transistor serves as the third output terminal, and both the first feedforward control terminal and the second feedforward control terminal are coupled to the first input terminal.

In some embodiments, the first transistor is a PMOS transistor, a source of the first transistor is coupled to a source of the seventh transistor, a drain of the first transistor is coupled to a drain of the ninth transistor, and a gate of the first transistor serves as the first clock signal input terminal;

the seventh transistor is a NMOS transistor, a drain of the seventh transistor is coupled to the power supply, and a gate of the seventh transistor serves as the first feedforward control terminal; and the ninth transistor is a NMOS transistor, a gate of the ninth transistor serves as the second feedforward control terminal, a source of the ninth transistor M9 serves as the third output terminal, and both the first feedforward control terminal and the second feedforward control terminal are coupled to the second input terminal.

In some embodiments, the first transistor is a PMOS transistor, a source of the first transistor is coupled to a drain of the seventh transistor, a drain of the first transistor is coupled to a drain of the ninth transistor, and a gate of the first transistor serves as the first clock signal input terminal;

the seventh transistor is a PMOS transistor, a source of the seventh transistor is coupled to the power supply, a gate of the seventh transistor serves as the first feedforward control terminal, and the first feedforward control terminal is coupled to the first input terminal; and the ninth transistor is a NMOS transistor, a gate of the ninth transistor serves as the second feedforward control terminal, a source of the ninth transistor serves as the third output terminal, and the second feedforward control terminal is coupled to the second input terminal.

In some embodiments, the first transistor is a PMOS transistor, a source of the first transistor is coupled to a source of the seventh transistor, a drain of the first transistor is coupled to a source of the ninth transistor, and a gate of the first transistor serves as the first clock signal input terminal;

the seventh transistor is a NMOS transistor, a drain of the seventh transistor is coupled to the power supply, a gate of the seventh transistor serves as the first feedforward control terminal, and the first feedforward control terminal is coupled to the second input terminal; and the ninth transistor is a PMOS transistor, a drain of the ninth transistor serves as the third output terminal, a gate of the ninth transistor serves as the second feedforward control terminal, and the second feedforward control terminal is coupled to the first input terminal.

In some embodiments, the first transistor is a PMOS transistor, a source of the first transistor is coupled to the power supply, a gate of the first transistor is coupled to a drain of the ninth transistor, and a drain of the first transistor is coupled to a source of the seventh transistor;

the seventh transistor is a PMOS transistor, a gate of the seventh transistor serves as the first feedforward control terminal, and a drain of the seventh transistor serves as the third output terminal; and the ninth transistor is a PMOS transistor, a gate of the ninth transistor serves as the second feedforward control terminal, a source of the ninth transistor serves as the first clock signal input terminal, and both the first feedforward control terminal the second feedforward control terminal are coupled to the first input terminal.

In some embodiments, the first transistor is a PMOS transistor, a source of the first transistor is coupled to the power supply, a gate of the first transistor is coupled to a source of the ninth transistor, and a drain of the first transistor is coupled to a drain of the seventh transistor;

the seventh transistor is a NMOS transistor, a gate of the seventh transistor serves as the first feedforward control terminal, and a source of the seventh transistor serves as the third output terminal; and the ninth transistor is a NMOS transistor, a gate of the ninth transistor serves as the second feedforward control terminal, a drain of the ninth transistor serves as the first clock signal input terminal, and both the first feedforward control terminal and the second feedforward control terminal are coupled to the second input terminal.

In some embodiments, the first transistor is a PMOS transistor, a source of the first transistor is coupled to a source of the seventh transistor, a gate of the first transistor is coupled to a source of the ninth transistor, and a drain of the first transistor serves as the third output terminal;

the seventh transistor is a NMOS transistor, a gate of the seventh transistor serves as the first feedforward control terminal, and a drain of the seventh transistor is coupled to the power supply; and the ninth transistor is a NMOS transistor, a gate of the ninth transistor serves as the second feedforward control terminal, a drain of the ninth transistor serves as the first clock signal input terminal, both the first feedforward control terminal and the second feedforward control terminal are coupled to the second input terminal.

In some embodiments, the first transistor is a PMOS transistor, a source of the first transistor is coupled to a drain of the seventh transistor, a gate of the first transistor is coupled to a drain of the ninth transistor, and a drain of the first transistor serves as the third output terminal;

the seventh transistor is a PMOS transistor, a gate of the seventh transistor serves as the first feedforward control terminal, and a source of the seventh transistor is coupled to the power supply; and the ninth transistor is a PMOS transistor, a gate of the ninth transistor serves as the second feedforward control terminal, a source of the ninth transistor serves as the first clock signal input terminal, and both the first feedforward control terminal and the second feedforward control terminal are coupled to the first input terminal.

In some embodiments, the first transistor is a PMOS transistor, a source of the first transistor is coupled to the power supply, a gate of the first transistor is coupled to a drain of the ninth transistor, and a drain of the first transistor is coupled to a source of the seventh transistor;

the seventh transistor is a PMOS transistor, a gate of the seventh transistor serves as the first feedforward control terminal and is coupled to a low-level signal, and a drain of the seventh transistor serves as the third output terminal; and the ninth transistor is a PMOS transistor, a source of the ninth transistor serves as the first clock signal input terminal, and a gate of the ninth transistor serves as the second feedforward control terminal and is coupled to the first input terminal.

In some embodiments, the second feedforward control unit includes a third feedforward control terminal, a fourth feedforward control terminal, a second transistor, an eighth transistor and a tenth transistor, and the second transistor is coupled to the eighth transistor and the tenth transistor.

In some embodiments, the second transistor is a PMOS transistor, a source of the second transistor is coupled to a drain of the eighth transistor, a drain of the second transistor is coupled to a source of the tenth transistor, and a gate of the second transistor serves as the second clock signal input terminal;

the eighth transistor is a PMOS transistor, a source of the eighth transistor is coupled to the power supply, and a gate of the eighth transistor serves as the third feedforward control terminal; and the tenth transistor is a PMOS transistor, a gate of the tenth transistor serves as the fourth feedforward control terminal, a drain of the tenth transistor serves as the fourth output terminal, and both the third feedforward control terminal and the fourth output terminal are coupled to the second input terminal.

In some embodiments, the second transistor is a PMOS transistor, a source of the second transistor is coupled to a source of the eighth transistor, a drain of the second transistor is coupled to a drain of the tenth transistor, and a gate of the second transistor serves as the second clock signal input terminal;

the eighth transistor M8 is a NMOS transistor, a drain of the eighth transistor is coupled to the power supply, and a gate of the eighth transistor serves as the third feedforward control terminal; and the tenth transistor is a NMOS transistor, a gate of the tenth transistor serves as the fourth feedforward control terminal, a source of the tenth transistor serves as the fourth output terminal, and both the third feedforward control terminal and the fourth output terminal are coupled to the first input terminal.

In some embodiments, the second transistor is a PMOS transistor, a source of the second transistor is coupled to a drain of the eighth transistor, a drain of the second transistor is coupled to a drain of the tenth transistor, and a gate of the second transistor serves as the second clock signal input terminal;

the eighth transistor is a PMOS transistor, a source of the eighth transistor is coupled to the power supply, a gate of the eighth transistor serves as the third feedforward control terminal, and the third feedforward control terminal is coupled to the second input terminal; and the tenth transistor is a NMOS transistor, a gate of the tenth transistor serves as the fourth feedforward control terminal, a source of the tenth transistor serves as the fourth output terminal. and the fourth feedforward control terminal is coupled to the first input terminal.

In some embodiments, the second transistor is a PMOS transistor, a source of the second transistor is coupled to a source of the eighth transistor, a drain of the second transistor is coupled to a source of the tenth transistor, and a gate of the second transistor serves as the second clock signal input terminal;

the eighth transistor is a NMOS transistor, a drain of the eighth transistor is coupled to the power supply, a gate of the eighth transistor serves as the third feedforward control terminal, and the third feedforward control terminal is coupled to the first input terminal; and the tenth transistor is a PMOS transistor, a gate of the tenth transistor serves as the fourth feedforward control terminal, a drain of the tenth transistor serves as the fourth output terminal, and the fourth feedforward control terminal is coupled to the second input terminal.

In some embodiments, the second transistor is a PMOS transistor, a source of the second transistor is coupled to the power supply, a gate of the second transistor is coupled to a drain of the tenth transistor, and a drain of the second transistor is coupled to a source of the eighth transistor;

the eighth transistor is a PMOS transistor, a gate of the eighth transistor serves as the third feedforward control terminal, and a drain of the eighth transistor serves as the fourth output terminal; and the tenth transistor is a PMOS transistor, a gate of the tenth transistor serves as the fourth feedforward control terminal, a source of the tenth transistor serves as the second clock signal input terminal, and both the third feedfoward control terminal and the fourth output terminal are coupled to the second input terminal.

In some embodiments, the second transistor is a PMOS transistor, a source of the second transistor is coupled to the power supply, a gate of the second transistor is coupled to a source of the tenth transistor, and a drain of the second transistor is coupled to a drain of the eighth transistor;

the eighth transistor is a NMOS transistor, a gate of the eighth transistor serves as the third feedforward control terminal, and a source of the eighth transistor serves as the fourth output terminal; and the tenth transistor is a NMOS transistor, a gate of the tenth transistor serves as the fourth feedforward control terminal, a drain of the tenth transistor serves as the second clock signal input terminal, and both the third feedforward control terminal and the fourth feedforward control terminal are coupled to the first input terminal.

In some embodiments, the second transistor is a PMOS transistor, a source of the second transistor is coupled to a source of the eighth transistor, a gate of the second transistor is coupled to a source of the tenth transistor, and a drain of second transistor serves as the fourth output terminal;

the eighth transistor is a NMOS transistor, a gate of the eighth transistor serves as the third feedforward control terminal, and a drain of the eighth transistor is coupled to the power supply; and the tenth transistor is a NMOS transistor, a gate of the tenth transistor serves as the fourth feedforward control terminal, a drain of the tenth transistor serves as the second clock signal input terminal, and both the third feedforward control terminal and the fourth feedforward control terminal are coupled to the first input terminal.

In some embodiments, the second transistor is a PMOS transistor, a source of the second transistor is coupled to a drain of the eighth transistor, a gate of the second transistor is coupled to a drain of the tenth transistor, and a drain of the second transistor serves as the fourth output terminal;

the eighth transistor is a PMOS transistor, a gate of the eighth transistor serves as the third feedforward control terminal, and a source of the eighth transistor is coupled to the power supply; and the tenth transistor is a PMOS transistor, a gate of the tenth transistor serves as the fourth feedforward control terminal, a source of the tenth transistor serves as the second clock signal input terminal, and both the third feedforward control terminal and the fourth feedforward control terminal are coupled to the second input terminal.

In some embodiments, at least one feedforward control terminal of the first feedforward control unit is coupled to the first input terminal, other feedforward control terminals of the first feedforward control unit are coupled to the ground wire, at least one feedforward control terminal of the second feedforward control unit is coupled to the second input terminal, and other feedforward control terminals of the second feedforward control unit are coupled to the ground wire;

or, at least one feedforward control terminal of the first feedforward control unit is coupled to the second input terminal, other feedforward control terminals of the first feedforward control unit are coupled to the ground wire, at least one feedforward control terminal of the second feedforward control unit is coupled to the first input terminal, and other feedforward control terminals of the second feedforward control unit are coupled to the ground wire.

Correspondingly, a frequency divider is also provided in embodiments of the present disclosure. The frequency divider includes at least two of the latches described above, wherein the at least two of the latches includes a first latch and a second latch, and the first input terminal and the second input terminal of the first latch are respectively coupled to the first output terminal and the second output terminal of the second latch.

Compared with the conventional technology, embodiments of the present disclosure have following advantages.

Current paths from the first logic unit to the power supply and the gourd wire can be cut off by the first feedforward control unit, so that static power consumption of the latch can be reduced.

A current path from the power supply to the first logic unit and the gourd wire can be cut off by the first feedforward control unit, another current path from the power supply to the second logic unit and the gourd wire can be cut off by the second feedforward control unit, so that the power supply charges the second output terminal, and the first output terminal is discharged to the gourd wire. Therefore, while the static power consumption of the latch is further reduced, a dynamic Alternating Current (AC) of the latch is eliminated, and an AC dynamic power consumption of the latch can be reduced.

DETAILED DESCRIPTION

Figure 1:
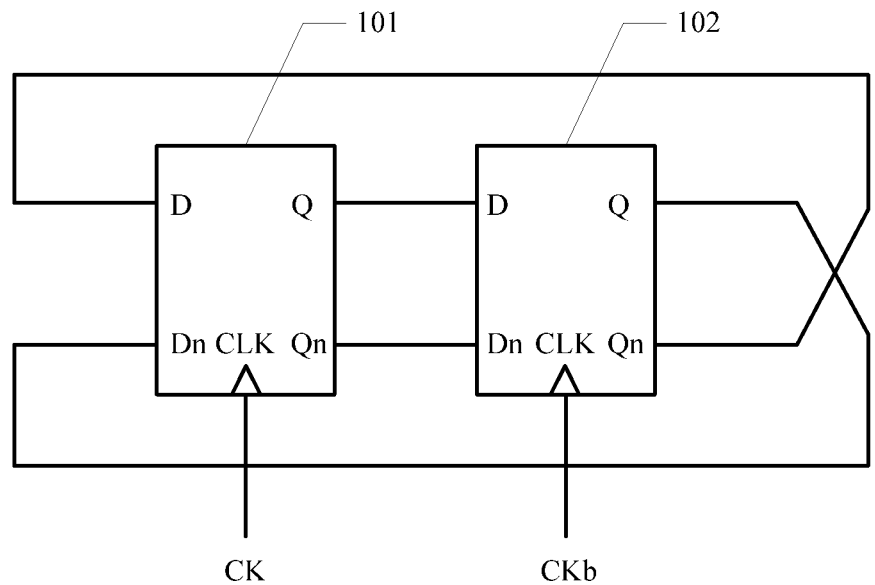
FIG. 1 schematically illustrates a circuit diagram of a conventional Razavi-structured divide-by-two frequency divider.

Referring to FIG. 1, a conventional high-speed divide-by-two divider is illustrated. The divider includes a first latch 101 and a second latch 102.

Both the first latch 101 and the second latch 102 are D flip-flops. A terminal D and a terminal Dn are input terminals, and a terminal Q and a terminal Qn are output terminals. A clock signal CK is input into a clock signal input terminal CLK of the first latch 101, and a clock signal CKb is input into a clock signal input terminal CLK of the second latch 102, wherein the clock signal CK and the clock signal CKb are opposite.

The terminal D of the first latch 101 is coupled to the terminal Qn of the second latch 102, the terminal Q of the first latch 101 is couple to the terminal D of the second latch 102, the terminal Dn of the first latch 101 is coupled to the terminal Q of the second latch 102, and the terminal Qn of the first latch 101 is coupled to the terminal Dn of the second latch 102. Namely, input terminals of the first latch 101 are respectively coupled to output terminals of the second latch 102, output terminals of the first latch 101 are respectively coupled to input terminals of the second latch 102. The first latch 101 and the second latch 102 are pre- and post-stages for each other.

Figure 2:
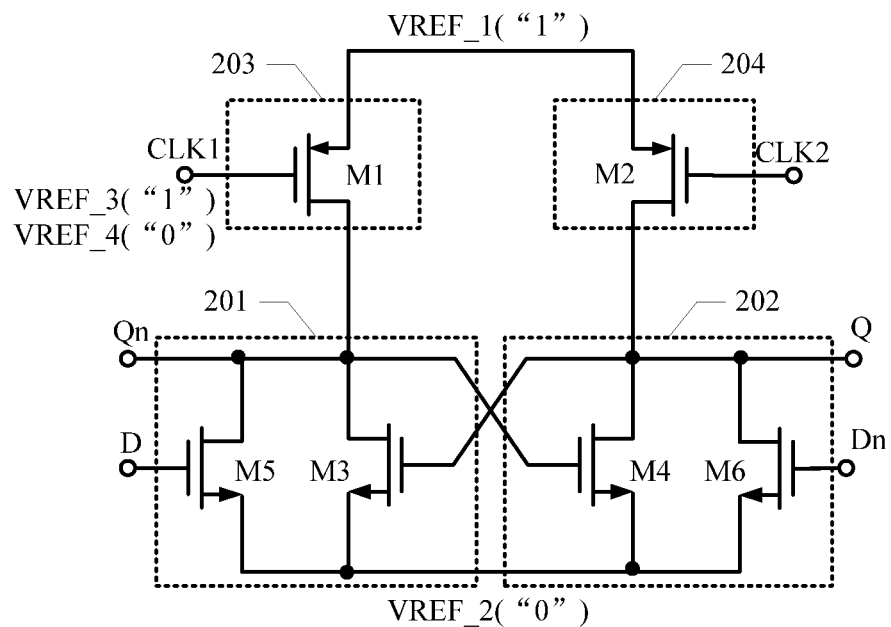
FIG. 2 schematically illustrates a circuit diagram of a latch in the frequency divider shown in FIG. 1.

FIG. 2 illustrates a circuit diagram of a latch in a high-speed divide-by-two divider for obtaining a divided signal with 25% duty-cycle. The latch includes a first logic unit 201, a second logic unit 202, a first control unit 203 and a second control unit 204.

The first logic unit 201 and the second logic unit 202 are coupled between a power supply VREF_1 and a ground wire VREF_2, and structures of them are symmetrical to each other.

The first control unit 203 is coupled between the first logic unit 201 and the voltage VREF_1, and has a clock signal input terminal CLK1. The second control unit 204 is coupled between the second logic unit 202 and the voltage VREF_1, and has a clock signal input terminal CLK2. A high-level signal VREF_3 or a low-level signal VREF_4 may be input into the clock signal input terminal CLK1 of the first control unit 203 or the clock signal input terminal CLK2 of the second control unit 204.

The first logic unit 201 includes a first signal input terminal D and a first signal output terminal Qn, and the second logic unit includes a second signal input terminal Dn and a second signal output terminal Q.

The first control unit 203 includes a first transistor M1, the second control unit 204 includes a second transistor M2, the first logic unit 201 includes a third transistor M3 and a fifth transistor M5, and the second logic unit 202 includes a fourth transistor M4 and a sixth transistor M6, wherein the first transistor M1 and the second transistor M2 are PMOS transistors, and the third transistor M3, the fourth transistor M4, the fifth transistor M5 and the sixth transistor M6 are NMOS transistors.

Sources of the first transistor M1 and the second transistor M2 are coupled to the power supply VREF_1, and a drain of the first transistor M1 is coupled to drains of the third transistor M3 and the fifth transistor M5, the first output terminal Qn and a gate of the fourth transistor M4. A drain of the second transistor M2 is coupled to drains of the fourth transistor M4 and the sixth transistor M6, the second output terminal Q, and a gate of the third transistor M3. Sources of the third transistor M3, the fourth transistor M4, the fifth transistor M5 and the sixth transistor M6 are coupled to the ground wire VREF_2.

When both the first clock signal input terminal CLK1 and the second clock signal input terminal CLK2 receive a low-level signal VREF_4 ("0"), the first transistor M1 and the second transistor M2 are turned on, and current paths can be formed between the voltage supply VREF_1 and the first output terminal Qn, the second output terminal Q. The fifth transistor M5 and the sixth transistor M6 sense a voltage difference between the first input terminal D and the second input terminal Dn, and output amplified signals at the second output terminal Q and the first output terminal Qn, so as to ensure a level of the second output terminal Q/the first output terminal Qn approaches VREF_1/VREF_2.

When both the first clock signal input terminal CLK1 and the second clock signal input terminal CLK2 receive a high-level signal VREF_3 ("1"), the first transistor M1 and the second transistor M2 are turned off, and current paths between the voltage supply VREF_1 and the first output terminal Qn/the second output terminal Q are cut off. The first output terminal Qn discharges through the fifth transistor M5, so as to ensure a level of the first output terminal Qn approaches the ground wire VREF_2. The second output terminal Q discharges through the sixth transistor M6, so as to ensure a level of the second output terminal Q approaches the ground wire VREF_2.

When a high-level signal is input into the first input terminal D and a low-level signal is input into the second input terminal Dn, the fifth transistor M5 is turned on, and the sixth transistor M6 is turned off, so that the third transistor M3 is turned on and the fourth transistor M4 is turned off at the same time such that the third transistor M3 is turned on simultaneously. At this moment, a Direct Current (DC) current path is formed from the power supply VREF_1 to the first transistor M1, the third transistor M3/the fifth transistor M5 and the ground wire VREF_2. Therefore, the latch has DC power consumption.

Under a dynamic mode, the latch is in a latch state. When both CLK1 and CLK2 receive the low-level signal VREF_4, the first transistor M1 and the second transistor M2 are turned on, and a current path exists between the power supply VREF_1 and the ground wire VREF_2, which may increase dynamic power consumption of the latch.

From above, it can be seen the conventional high-speed divide-by-two frequency divider has static and dynamic power consumption under static operating mode and dynamic operating mode respectively, which restricts applications of the high-speed divide-by-two frequency divider seriously.

In embodiments of the present disclosure, a latch is provided. The latch includes a first feedforward control unit. By using the first feedforward control unit, the current path from the power supply to the first logic unit and the ground wire, or the current path from the power supply to the second logic unit and the ground wire, can be cut off. Therefore, power consumption of the latch can be reduced by cutting off current paths between the power supply and the ground wire.

In order to clarify the objects, characteristics and advantages of the disclosure, the embodiments of the present disclosure will be described in detail in conjunction with the accompanying drawings.

Figure 3:
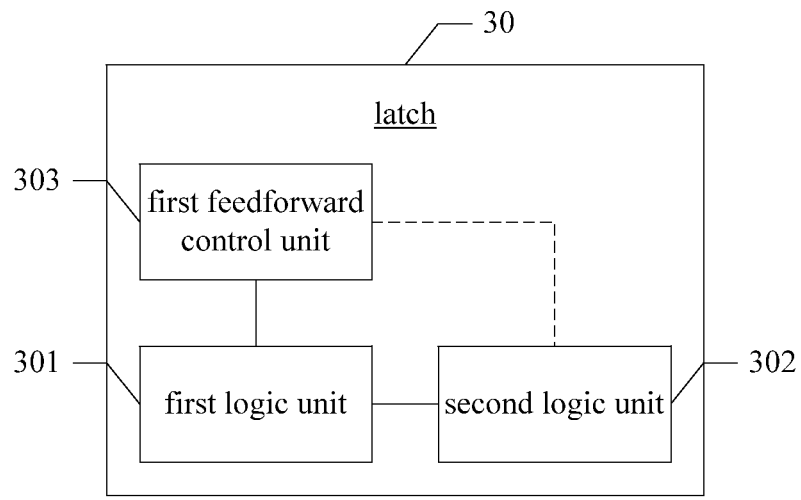
FIG. 3 schematically illustrates a block diagram of a latch according to one embodiment of the present disclosure.

A block diagram of a latch 30 is illustrated in FIG. 3 according to one embodiment of the present disclosure. The latch 30 includes a first logic unit 301, a second logic unit 302 and a first feedforward control unit 303, wherein the first control unit 301 is symmetrical to the second logic unit 302, and the first feedforward control unit 303 is adapted to cut off a current path between a power supply and a ground wire.

The first logic unit 301 may include a first input terminal, a first output terminal, and the second logic unit 302 may include a second input terminal, a second output terminal. The first feedforward control unit 303 may include a first clock signal input terminal, a third output terminal and at least two feedforward control terminals, wherein the first clock signal input terminal is adapted to receive a first clock signal, the third output terminal is coupled to the first input terminal, at least one of the feedforward control terminals is coupled to the first input terminal or the second input terminal.

It can be seen that, by using the first feedforward control unit, the current path from the power supply to the first logic unit and the ground wire, or the current path from the power supply to the second logic unit and the ground wire, can be cut off. Therefore, power consumption of the latch can be reduced by cutting off current paths between the power supply and the ground wire.

In one embodiment, the latch 30 may further include a second feedforward control unit, which is adapted to cut off a current path between the power supply and the ground wire. The current path controlled by the second feedforward control unit is different from the current path controlled by the first feedforward control unit 303.

In some embodiments, the second feedforward control unit may include a second clock signal input terminal, a fourth output terminal and at least two feedforward control terminals, wherein the second clock signal input terminal is adapted to receive a second clock signal, the fourth output terminal is coupled to the second output terminal, at least one of the feedforward control terminals is coupled to the second input terminal or the first input terminal.

When the latch 30 includes both the first feedforward control unit and the second feedforward control unit, components in the latch 30 can be connected as following two forms:

1) in the first feedforward control unit, the first clock signal input terminal is adapted to receive a first clock signal, the third output terminal is coupled to the first output terminal, at least one of the frontforward control terminals is coupled to the first input terminal, and the rest of the frontforward control terminals are coupled to the ground wire; and in the second feedforward control unit, the second clock signal input terminal is adapted to receive a second clock signal, the fourth output terminal is coupled to the second output terminal, at least one of the frontforward control terminals is coupled to the second output terminal, and the rest of the frontforward control terminals are coupled to the ground wire;

2) in the first feedforward control unit, the first clock signal input terminal is adapted to receive a first clock signal, the third output terminal is coupled to the first output terminal, at least one of the frontforward control terminals is coupled to the second input terminal, and the rest of the frontforward control terminals are coupled to the ground wire; and in the second feedforward control unit, the second clock signal input terminal is adapted to receive a second clock signal, the fourth output terminal is coupled to the second output terminal, at least one of the frontforward control terminals is coupled to the first output terminal, and the rest of the frontforward control terminals are coupled to the ground wire.

Referring to FIGS. 4-11, a plurality of latches are illustrated according to embodiments of the present disclosure. The first feedforward control unit of each latch includes a first feedforward control terminal and a second feedforward control terminal.

The first feedforward control unit may include a first transistor M1, a seventh transistor M7 and a ninth transistor M9, which are coupled to each other. The latches in FIGS. 4-11 will be described in conjunction with FIG. 2 respectively.

Figure 4:
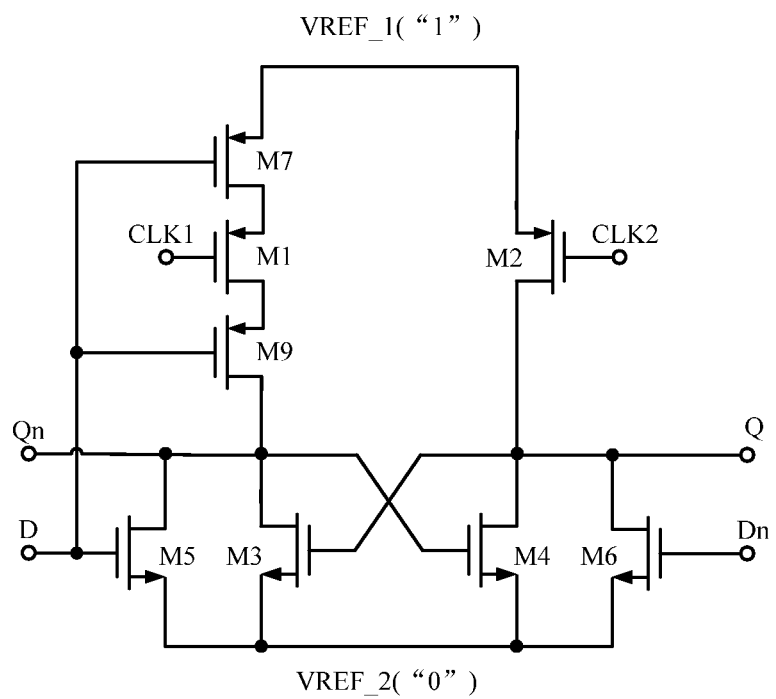
FIGS. 4-24 schematically illustrate different circuit configurations of a latch according to different embodiments of the present disclosure.

As shown in FIG. 4, the first feedforward control unit may include a first transistor M1, a seventh transistor M7 and a ninth transistor M9.

The first transistor M1 is a PMOS transistor, a source of the first transistor M1 is coupled to a drain of the seventh transistor M7, a drain of the first transistor M1 is coupled to a source of the ninth transistor M9, and a gate of the first transistor M1 serves as the first clock signal input terminal CLK1 of the first feedforward control unit to receive the first clock signal.

The seventh transistor M7 is a PMOS transistor, a source of the seventh transistor M7 is coupled to the power supply VREF_1, and a gate of the seventh transistor M7 serves as the first feedforward control terminal of the first feedforward control unit and is coupled to the first input terminal D.

The ninth transistor M9 is a PMOS transistor, a gate of the ninth transistor M9 serves as the second feedforward control terminal of the first feedforward control unit and is coupled to the first input terminal D, and a drain of the ninth transistor M9 serves as the third output terminal.

When a high-level signal is input into the first input terminal D and a low-level signal is input into the second input terminal Dn, the seventh transistor M7 and the ninth transistor M9 are turned off. Correspondingly, a current path from the first transistor M1 to the seventh transistor M7 and the ninth transistor M9 is cut off, thus a current path from the power supply VREF_1 to the seventh transistor M7, the first transistor M1, the ninth transistor M9, the third transistor M3/the fifth transistor M5, and the ground wire VREF_2 is also cut off. That is, the current path between the power supply VREF_1 and the ground wire VREF_2 is cut off, thus the DC power consumption of the latch can be reduced.

Figure 5:
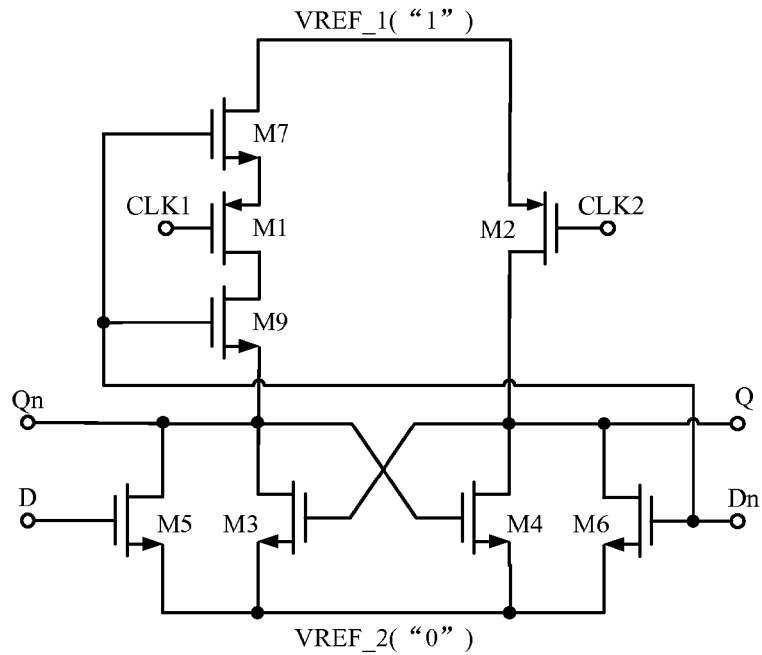

Referring to FIG. 5, a circuit diagram of a latch is illustrated according to another embodiment of the present disclosure.

As shown in FIG. 5, the first transistor M1 is a PMOS transistor, a source of the first transistor M1 is coupled to a source of the seventh transistor M7, a drain of the first transistor M1 is coupled to a drain of the ninth transistor M9, and a gate of the first transistor M1 serves as the first clock signal input terminal CLK1 of the first feedforward control unit to receive the first clock signal.

The seventh transistor M7 is a NMOS transistor, a drain of the seventh transistor M7 is coupled to the power supply VREF_1, and a gate of the seventh transistor M7 serves as the first feedforward control terminal of the first feedforward control unit and is coupled to the second input terminal Dn.

The ninth transistor M9 is a NMOS transistor, a gate of the ninth transistor M9 serves as the second feedforward control terminal of the first feedforward control unit and is coupled to the second input terminal Dn, and a source of the ninth transistor M9 serves as the third output terminal.

When a high-level signal is input into the first input terminal D and a low-level signal is input into the second input terminal Dn, the seventh transistor M7 is turned off. Correspondingly, a current path from the first transistor M1 to the seventh transistor M7 and the ninth transistor M9 is cut off, thus a current path from the first logic unit to the power supply VREF_1 and the ground wire VREF_2 is also cut off. Therefore, the DC power consumption of the latch can be reduced.

Figure 6:
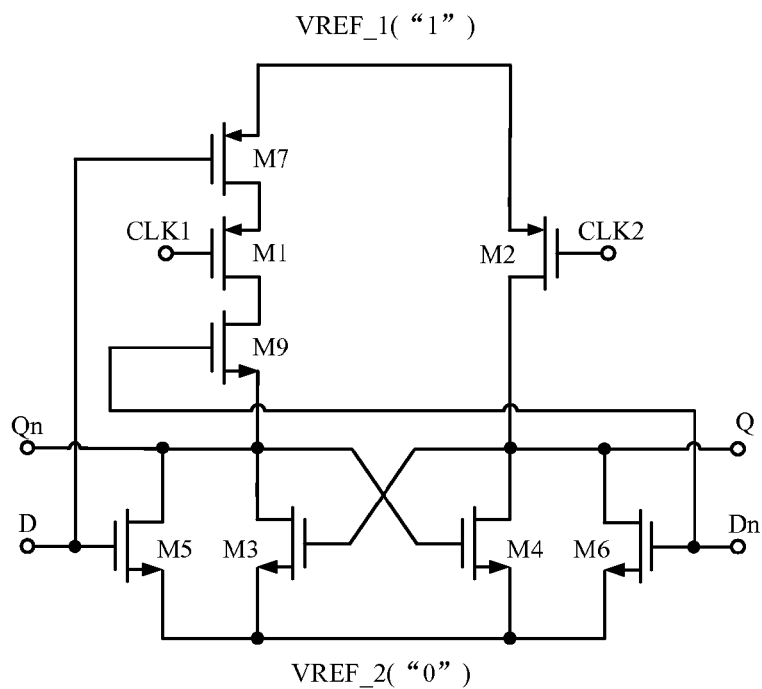

Referring to FIG. 6, a circuit diagram of a latch is illustrated according to another embodiment of the present disclosure.

As shown in FIG. 6, the first transistor M1 is a PMOS transistor, a source of the first transistor M1 is coupled to a drain of the seventh transistor M7, a drain of the first transistor M1 is coupled to a drain of the ninth transistor M9, and a gate of the first transistor M1 serves as the first clock signal input terminal CLK1 of the first feedforward control unit to receive the first clock signal.

The seventh transistor M7 is a PMOS transistor, a source of the seventh transistor M7 is coupled to the power supply VREF_1, and a gate of the seventh transistor M7 serves as the first feedforward control terminal of the first feedforward control unit and is coupled to the first input terminal D.

The ninth transistor M9 is a NMOS transistor, a gate of the ninth transistor M9 serves as the second feedforward control terminal of the first feedforward control unit and is coupled to the second input terminal Dn, and a source of the ninth transistor M9 serves as the third output terminal.

When a high-level signal is input into the first input terminal D and a low-level signal is input into the second input terminal Dn, the seventh transistor M7 is turned off. Correspondingly, a current path from the first transistor M1 to the seventh transistor M7 and the ninth transistor M9 is cut off, thus a current path from the power supply VREF_1 to the seventh transistor M7, the first transistor M1, the ninth transistor M9, the third transistor M3/the fifth transistor M5, and the ground wire VREF_2 is also cut off. Therefore, the DC power consumption of the latch can be reduced.

Figure 7:
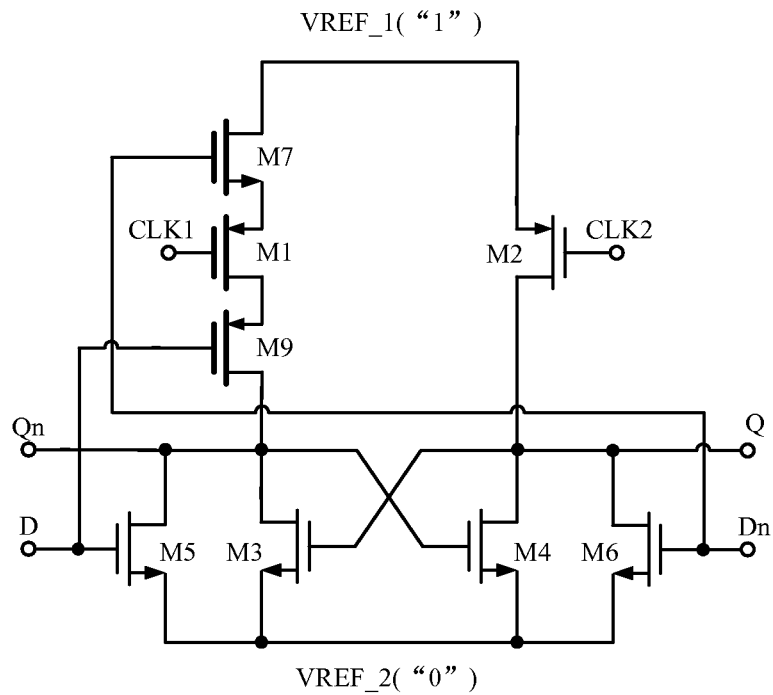

Referring to FIG. 7, a circuit diagram of a latch is illustrated according to another embodiment of the present disclosure.

As shown in FIG. 7, the first transistor M1 is a PMOS transistor, a source of the first transistor M1 is coupled to a source of the seventh transistor M7, a drain of the first transistor M1 is coupled to a source of the ninth transistor M9, and a gate of the first transistor M1 serves as the first clock signal input terminal CLK1.

The seventh transistor M7 is a NMOS transistor, a drain of the seventh transistor M7 is coupled to the power supply VREF_1, a gate of the seventh transistor M7 serves as the first feedforward control terminal, and the first feedforward control terminal is coupled to the second input terminal Dn.

The ninth transistor M9 is a PMOS transistor, a drain of the ninth transistor M9 serves as the third output terminal, a gate of the ninth transistor M9 serves as the second feedforward control terminal, and the second feedforward control terminal is coupled to the first input terminal D.

When a high-level signal is input into the first input terminal D and a low-level signal is input into the second input terminal Dn, the seventh transistor M7 is turned off. Correspondingly, a current path from the first transistor M1 to the seventh transistor M7 and the ninth transistor M9 is cut off, thus a current path from the first logic unit to the power supply VREF_1 and the ground wire VREF_2 is also cut off. Therefore, the DC power consumption of the latch can be reduced.

Figure 8:
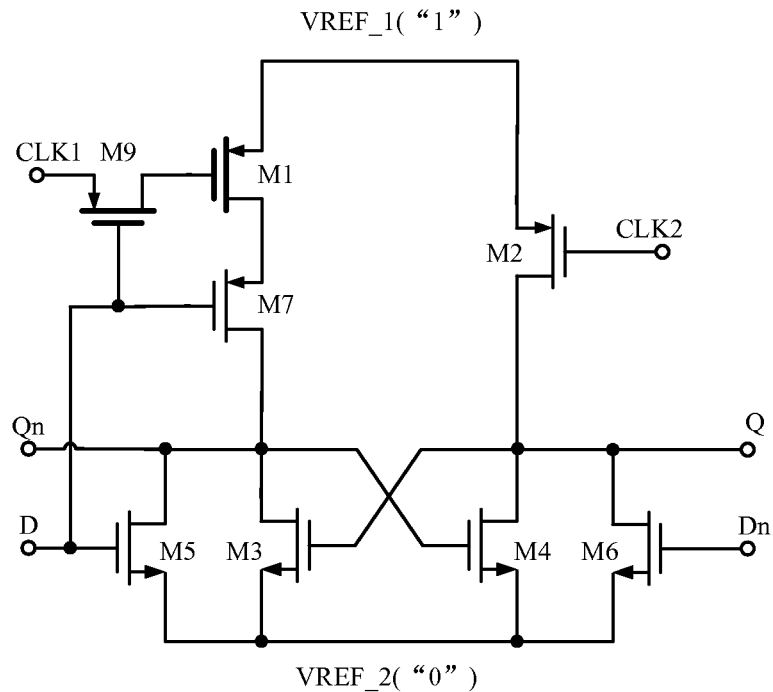

Referring to FIG. 8, a circuit diagram of a latch is illustrated according to another embodiment of the present disclosure.

As shown in FIG. 8, the first transistor M1 is a PMOS transistor, a source of the first transistor M1 is coupled to the power supply VREF_1, a gate of the first transistor M1 is coupled to a drain of the ninth transistor M9, and a drain of the first transistor M1 is coupled to a source of the seventh transistor M7.

The seventh transistor M7 is a PMOS transistor, a gate of the seventh transistor M7 serves as the first feedforward control terminal of the first feedforward control unit and is coupled to the first input terminal D, and a drain of the seventh transistor M7 serves as the third output terminal.

The ninth transistor M9 is a PMOS transistor, a source of the ninth transistor M9 serves as the first clock signal input terminal CLK1, and a gate of the ninth transistor M9 serves as the second feedforward control terminal of the first feedforward control unit and is coupled to the first input terminal D.

When a high-level signal is input into the first input terminal D and a low-level signal is input into the second input terminal Dn, the seventh transistor M7 is turned off, thus a current path from the first logic unit to the power supply VREF_1 and the ground wire VREF_2 is cut off. Therefore, the DC power consumption of the latch can be reduced.

Figure 9:
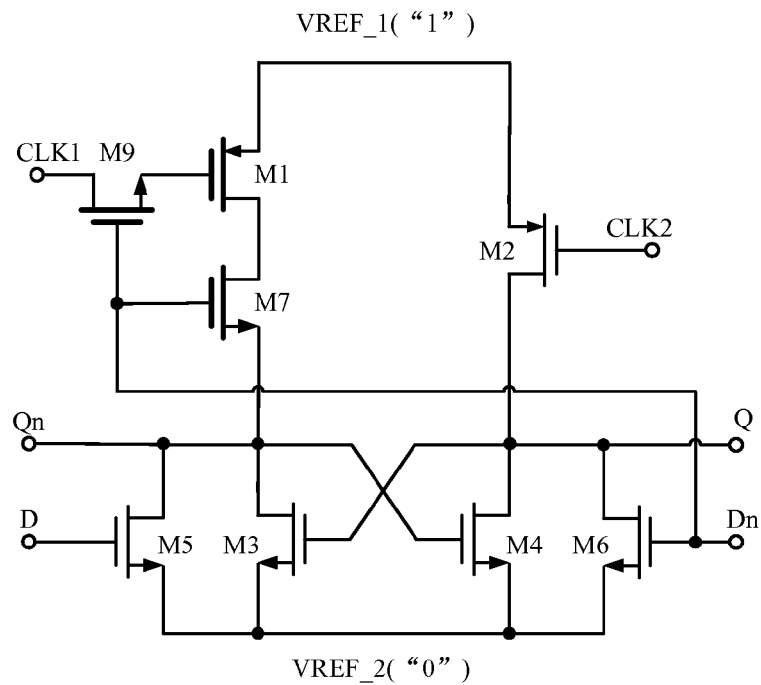

Referring to FIG. 9, a circuit diagram of a latch is illustrated according to another embodiment of the present disclosure.

As shown in FIG. 9, the first transistor M1 is a PMOS transistor, a source of the first transistor M1 is coupled to the power supply VREF_1, a gate of the first transistor M1 is coupled to a source of the ninth transistor M9, and a drain of the first transistor M1 is coupled to a drain of the seventh transistor M7.

The seventh transistor M7 is a NMOS transistor, a gate of the seventh transistor M7 serves as the first feedforward control terminal, and a source of the seventh transistor M7 serves as the third output terminal.

The ninth transistor M9 is a NMOS transistor, a gate of the ninth transistor M9 serves as the second feedforward control terminal, a drain of the ninth transistor M9 serves as the first clock signal input terminal CLK1, and both the first feedforward control terminal and the second feedforward control terminal are coupled to the second input terminal Dn.

When a high-level signal is input into the first input terminal D and a low-level signal is input into the second input terminal Dn, the first transistor M1 and the ninth transistor M9 are turned off. Correspondingly, a current path from the first transistor M1 to the seventh transistor M7 and the ninth transistor M9 is cut off, thus a current path from the first logic unit to the power supply VREF_1 and the ground wire VREF_2 is also cut off. Therefore, the DC power consumption of the latch can be reduced.

Figure 10:
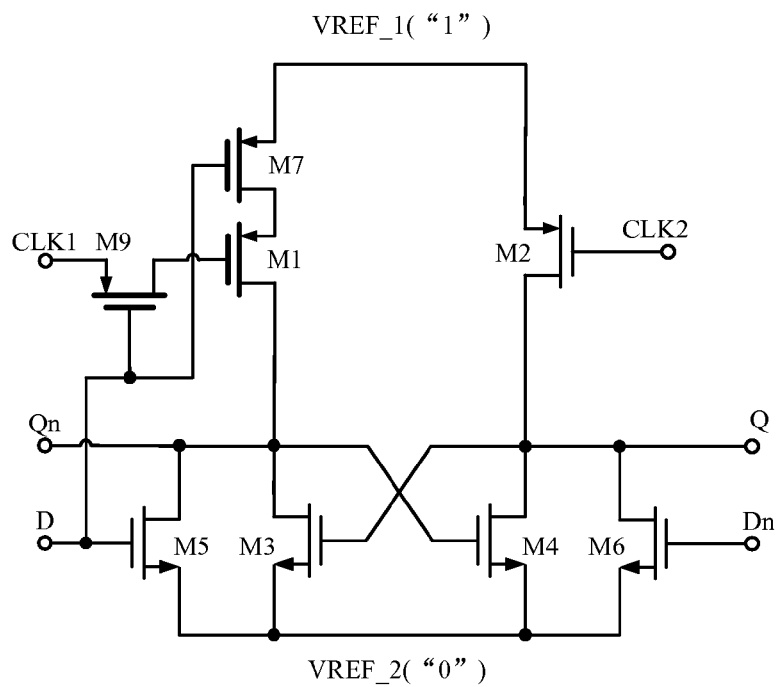

Referring to FIG. 10, a circuit diagram of a latch is illustrated according to another embodiment of the present disclosure.

As shown in FIG. 10, the first transistor M1 is a PMOS transistor, a source of the first transistor M1 is coupled to a drain of the seventh transistor M7, a gate of the first transistor M1 is coupled to a drain of the ninth transistor M9, and a drain of the first transistor M1 serves as the third output terminal.

The seventh transistor M7 is a PMOS transistor, a gate of the seventh transistor M7 serves as the first feedforward control terminal of the first feedforward control unit and is coupled to the first input terminal D, and a source of the seventh transistor M7 is coupled to the power supply VREF_1.

The ninth transistor M9 is a PMOS transistor, a gate of the ninth transistor M9 serves as the second feedforward control terminal of the first feedforward control unit and is coupled to the first input terminal D, and a source of the ninth transistor M9 serves as the first clock signal input terminal CLK1.

When a high-level signal is input into the first input terminal D and a low-level signal is input into the second input terminal Dn, the seventh transistor M7 is turned off, thus a current path from the first logic unit to the power supply VREF_1 and the ground wire VREF_2 is cut off. Therefore, the DC power consumption of the latch can be reduced.

Figure 11:
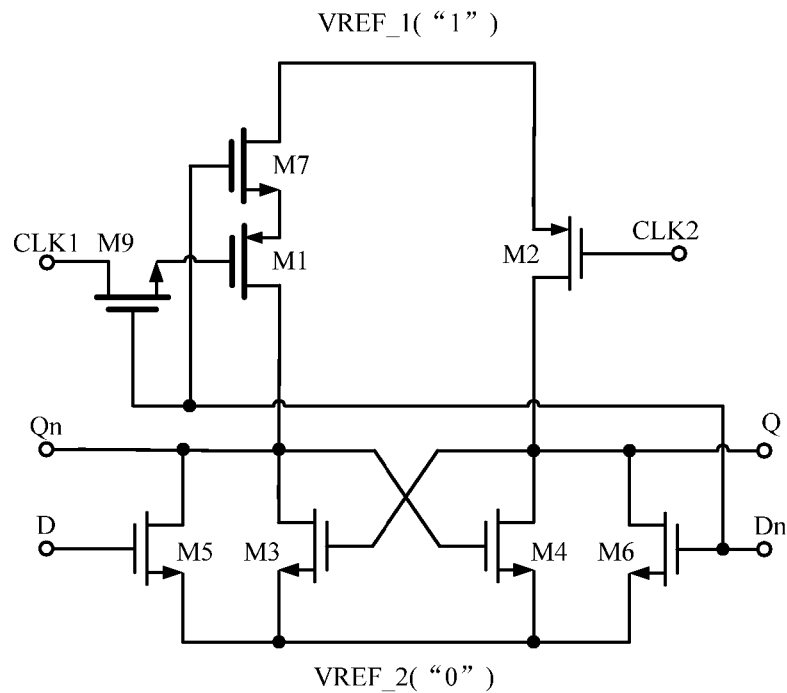

Referring to FIG. 11, a circuit diagram of a latch is illustrated according to another embodiment of the present disclosure.

As shown in FIG. 11, the first transistor M1 is a PMOS transistor, a source of the first transistor M1 is coupled to a source of the seventh transistor M7, a gate of the first transistor M1 is coupled to a source of the ninth transistor M9, and a drain of the first transistor M1 serves as the third output terminal.

The seventh transistor M7 is a NMOS transistor, a gate of the seventh transistor M7 serves as the first feedforward control terminal of the first feedforward control unit and is coupled to the second input terminal Dn, and a drain of the seventh transistor M7 is coupled to the power supply VREF_1.

The ninth transistor M9 is a NMOS transistor, a gate of the ninth transistor M9 serves as the second feedforward control terminal of the first feedforward control unit and is coupled to the second input terminal Dn, and a drain of the ninth transistor M9 serves as the first clock signal input terminal CLK1.

When a high-level signal is input into the first input terminal D and a low-level signal is input into the second input terminal Dn, the seventh transistor M7 is turned off. Correspondingly, a current path from the first transistor M1 to the seventh transistor M7 and the ninth transistor M9 is cut off, thus a current path from the first logic unit to the power supply VREF_1 and the ground wire VREF_2 is also cut off. Therefore, the DC power consumption of the latch can be reduced.

In above embodiments, both the first feedforward control terminal and the second feedforward control terminal are coupled to the first input terminal D or the second input terminal Dn. In other embodiments of the present disclosure, one of the first feedforward control terminal and the second feedforward control terminal may be coupled to a low-level signal. For example, the first feedforward control terminal is coupled to the first input terminal D, and the second feedforward control terminal is coupled to a low-level signal. In another example, the first feedforward control terminal is coupled to a low-level signal, and the second feedforward control terminal is coupled to the second input terminal Dn.

Figure 12:
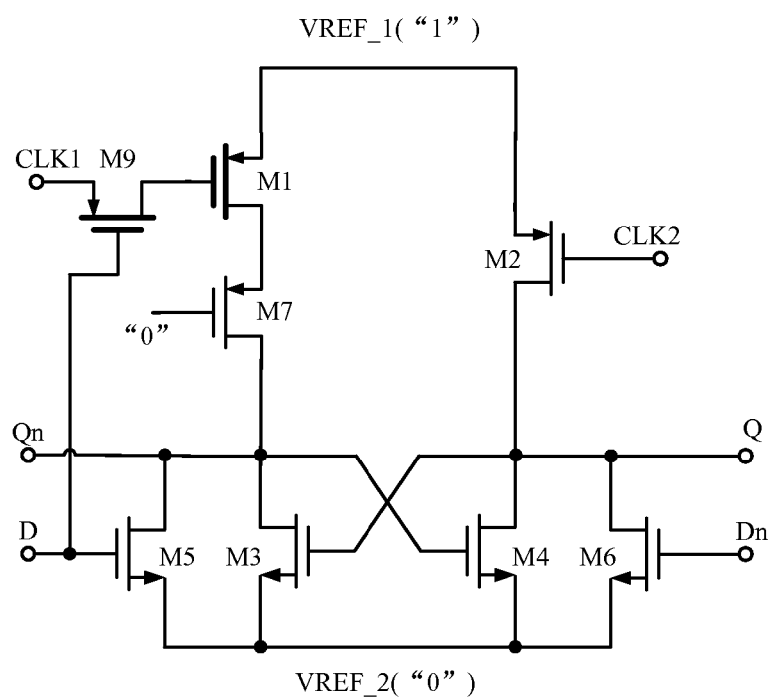

Referring to FIG. 12, a circuit diagram of a latch is illustrated according to another embodiment of the present disclosure.

As shown in FIG. 12, the first transistor M1 is a PMOS transistor, a source of the first transistor M1 is coupled to the power supply VREF_1, a gate of the first transistor M1 is coupled to a drain of the ninth transistor M9, and a drain of the first transistor M1 is coupled to a source of the seventh transistor M7.

the seventh transistor M7 is a PMOS transistor, a gate of the seventh transistor M7 serves as the first feedforward control terminal of the first feedforward control unit and is coupled to a low-level signal "0", and a drain of the seventh transistor M7 serves as the third output terminal.

The ninth transistor M9 is a PMOS transistor, a source of the ninth transistor M9 serves as the first clock signal input terminal CLK1, and a gate of the ninth transistor M9 serves as the second feedforward control terminal of the first feedforward control unit and is coupled to the first input terminal D.

When a high-level signal is input into the first input terminal D and a low-level signal is input into the second input terminal Dn, the second feedforward control terminal is at high-level, that is, the gate of the ninth transistor is at high level. As the ninth transistor M9 is a NMOS transistor, the ninth transistor M9 is turn on. Correspondingly, the gate of the first transistor M1 has a voltage drop. Because the source of the first transistor M1 is coupled to the power supply VREF_1 and the first transistor M1 is a PMOS transistor, the first transistor M1 is turn on. The first feedforward control terminal is coupled to a low-level signal "0". That is, the gate of the seventh transistor M7 is at low-level. As the seventh transistor M7 is a PMOS, the seventh transistor M7 is also turn on under a condition that the first transistor M1 is turn on. Therefore, there is a current path in a circuit constituted by the first transistor M1, the seventh transistor M7 and the ninth transistor M9.

In this case, an operating speed of the latch can be improved. However, because the current path existing in the circuit constituted by the first transistor M1, the seventh transistor M7 and the ninth transistor M9, the latch may have a DC power consumption. Therefore, in practical applications, a tradeoff can be made between power consumption and operating speed by changing connection modes of the first feedforward control terminal and the second feedforward control terminal.

In other words, when the first feedforward control unit in the latch provided in above embodiments has at least two feedforward control terminals, the connection mode of the at least two feedforward control terminals can be flexibly controlled, so that a tradeoff can be made between power consumption and operating speed.

It should be understood that, the first feedforward control unit is not limited to those circuit configurations provided in above embodiments. In other embodiments, the latch may have other circuit configurations, as long as the current path between the power supply and the ground wire is cut off. A number of the feedforward control terminals in the first feedforward control unit is not limited to two, but can be determined according to actual needs.

Referring to FIGS. 13-20, a plurality of latches are illustrated according to other embodiments of the present disclosure. Each latch includes a second feedforward control unit. The second feedforward control unit includes a third feedforward control terminal and a fourth feedforward control terminal. Both the third feedforward control terminal and the fourth feedforward control terminal can be coupled to the second input terminal Dn or the first input terminal D.

The second feedforward control unit may include a second transistor M2, an eighth transistor M8 and a tenth transistor M10. The latches in FIGS. 13-19 will be described in conjunction with FIG. 2 respectively.

Figure 13:
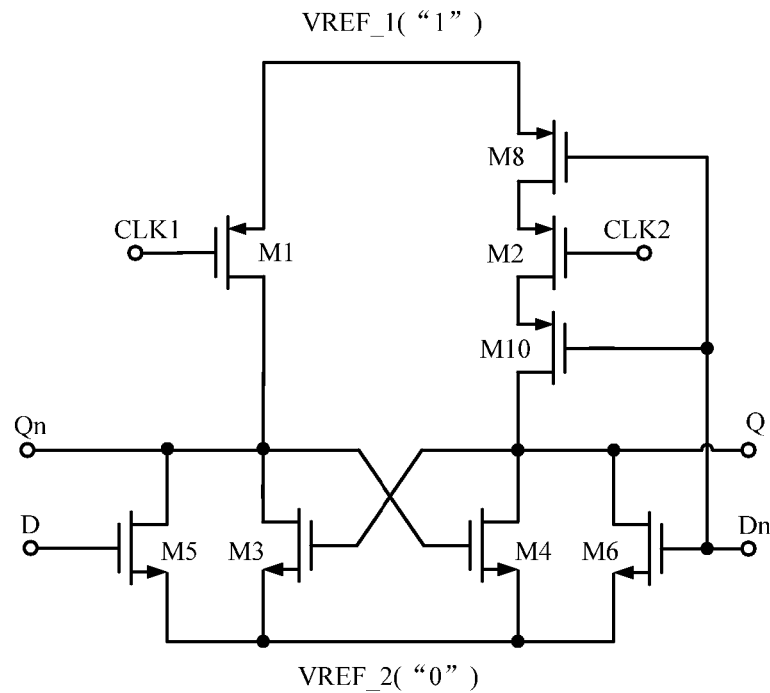

Referring to FIG. 13, a circuit diagram of a latch is illustrated according to another embodiment of the present disclosure.

As shown in FIG. 13, the second transistor M2 is a PMOS transistor, a source of the second transistor M2 is coupled to a drain of the eighth transistor M8, a drain of the second transistor M2 is coupled to a source of the tenth transistor M10, and a gate of the second transistor M2 serves as the second clock signal input terminal CLK2 of the second feedforward control unit to receive the second clock signal.

The eighth transistor M8 is a PMOS transistor, a source of the eighth transistor M8 is coupled to the power supply VREF_1, and a gate of the eighth transistor M8 serves as the third feedforward control terminal of the second feedforward control unit and is coupled to the second input terminal Dn.

The tenth transistor M10 is a PMOS transistor, a gate of the tenth transistor M10 serves as the fourth feedforward control terminal of the second feedforward control unit and is coupled to the second input terminal Dn, and a drain of the tenth transistor M10 serves as the fourth output terminal.

When a high-level signal is input into the second input terminal Dn and a low-level signal is input into the first input terminal D, the eighth transistor M8 and the tenth transistor M10 are turned off. Correspondingly, a current path from the second transistor M2 to the eighth transistor M8 and the tenth transistor M10 is cut off, thus a current path from the power supply VREF_1 to the eighth transistor M8, the second transistor M2, the tenth transistor M10, the fourth transistor M4/the sixth transistor M6, and the ground wire VREF_2 is also cut off. That is, a current path from the second logic unit to the power supply VREF_1 and the ground wire VREF_2 is cut off, thus the DC power consumption of the latch can be reduced.

Figure 14:
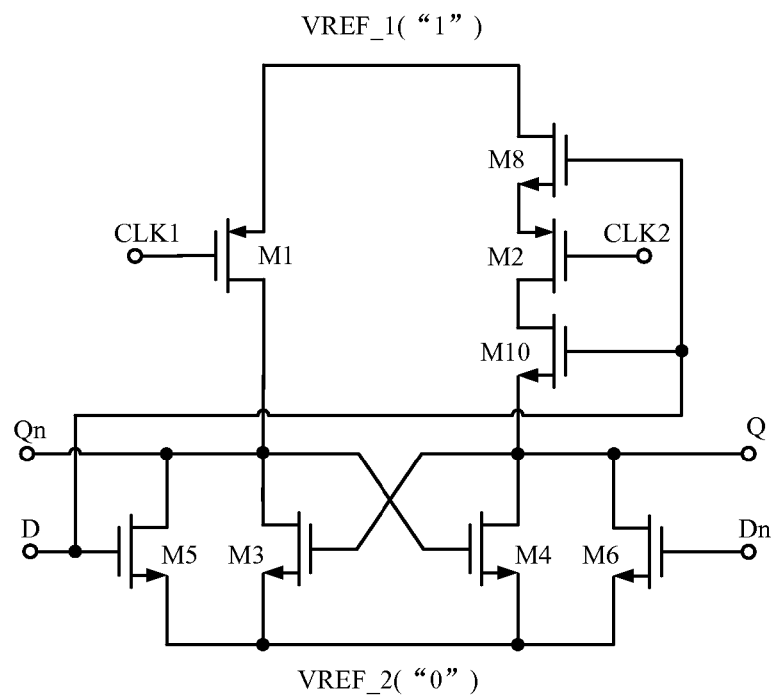

Referring to FIG. 14, a circuit diagram of a latch is illustrated according to another embodiment of the present disclosure. As shown in FIG. 14, the second transistor M2 is a PMOS transistor, a source of the second transistor M2 is coupled to a source of the eighth transistor M8, a drain of the second transistor M2 is coupled to a drain of the tenth transistor M10, and a gate of the second transistor M2 serves as the second clock signal input terminal CLK2 of the second feedforward control unit to receive the second clock signal.

The eighth transistor M8 is a NMOS transistor, a drain of the eighth transistor M8 is coupled to the power supply VREF_1, and a gate of the eighth transistor M8 serves as the third feedforward control terminal of the second feedforward control unit and is coupled to the first input terminal D.

The tenth transistor M10 is a NMOS transistor, a gate of the tenth transistor M10 serves as the fourth feedforward control terminal of the second feedforward control unit and is coupled to the first input terminal D, and a source of the tenth transistor M10 serves as the fourth output terminal.

When a high-level signal is input into the second input terminal Dn and a low-level signal is input into the first input terminal D, the eighth transistor M8 is turned off. Correspondingly, a current path from the second transistor M2 to the eighth transistor M8 and the tenth transistor M10 is cut off, thus a current path from the second logic unit to the power supply VREF_1 and the ground wire VREF_2 is cut off. Therefore, the DC power consumption of the latch can be reduced.

Figure 15:
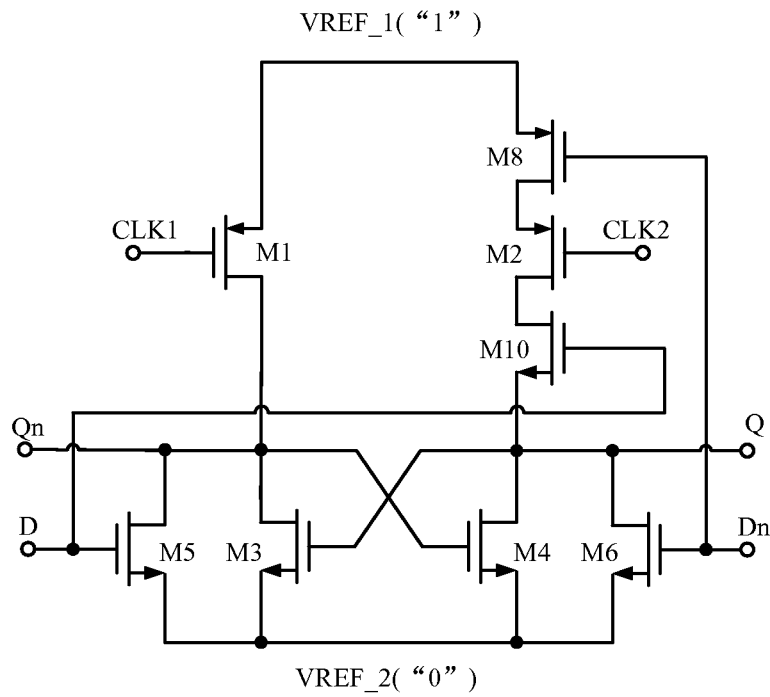

Referring to FIG. 15, a circuit diagram of a latch is illustrated according to another embodiment of the present disclosure.

As shown in FIG. 15, the second transistor M2 is a PMOS transistor, a source of the second transistor M2 is coupled to a drain of the eighth transistor M8, a drain of the second transistor M2 is coupled to a drain of the tenth transistor M10, and a gate of the second transistor M2 serves as the second clock signal input terminal CLK2 of the second feedforward control unit to receive the second clock signal.

The eighth transistor M8 is a PMOS transistor, a source of the eighth transistor M8 is coupled to the power supply VREF_1, and a gate of the eighth transistor M8 serves as the third feedforward control terminal of the second feedforward control unit and is coupled to the second input terminal Dn.

The tenth transistor M10 is a NMOS transistor, a gate of the tenth transistor M10 serves as the fourth feedforward control terminal of the second feedforward control unit and is coupled to the first input terminal D, and a source of the tenth transistor M10 serves as the fourth output terminal.

When a high-level signal is input into the second input terminal Dn and a low-level signal is input into the first input terminal D, the eighth transistor M8 is turned off. Correspondingly, a current path from the second transistor M2 to the eighth transistor M8 and the tenth transistor M10 is cut off, thus a current path from the power supply VREF_1 to the eighth transistor M8, the second transistor M2, the tenth transistor M10, the fourth transistor M4/the sixth transistor M6, and the ground wire VREF_2 is also cut off. Therefore, the DC power consumption of the latch can be reduced.

Figure 16:
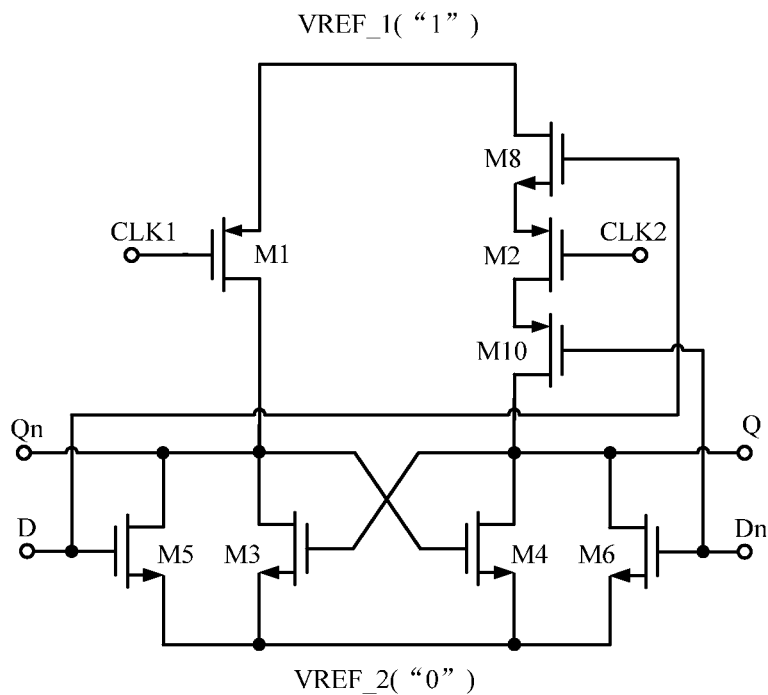

Referring to FIG. 16, a circuit diagram of a latch is illustrated according to another embodiment of the present disclosure.

As shown in FIG. 16, the second transistor M2 is a PMOS transistor, a source of the second transistor M2 is coupled to a source of the eighth transistor M8, a drain of the second transistor M2 is coupled to a source of the tenth transistor M10, and a gate of the second transistor M2 serves as the second clock signal input terminal CLK2.

The eighth transistor M8 is a NMOS transistor, a drain of the eighth transistor M8 is coupled to the power supply VREF_1, a gate of the eighth transistor M8 serves as the third feedforward control terminal, and the third feedforward control terminal is coupled to the first input terminal D.

The tenth transistor M10 is a PMOS transistor, a gate of the tenth transistor M10 serves as the fourth feedforward control terminal, a drain of the tenth transistor M10 serves as the fourth output terminal, and the fourth feedforward control terminal is coupled to the second input terminal Dn.

When a high-level signal is input into the second input terminal Dn and a low-level signal is input into the first input terminal D, the eighth transistor M8 and the tenth transistor M10 are turned off. Correspondingly, a current path from the second transistor M2 to the eighth transistor M8 and the tenth transistor M10 is cut off, thus a current path from the second logic unit to the power supply VREF_1 and the ground wire VREF_2 is cut off. Therefore, the DC power consumption of the latch can be reduced.

Figure 17:
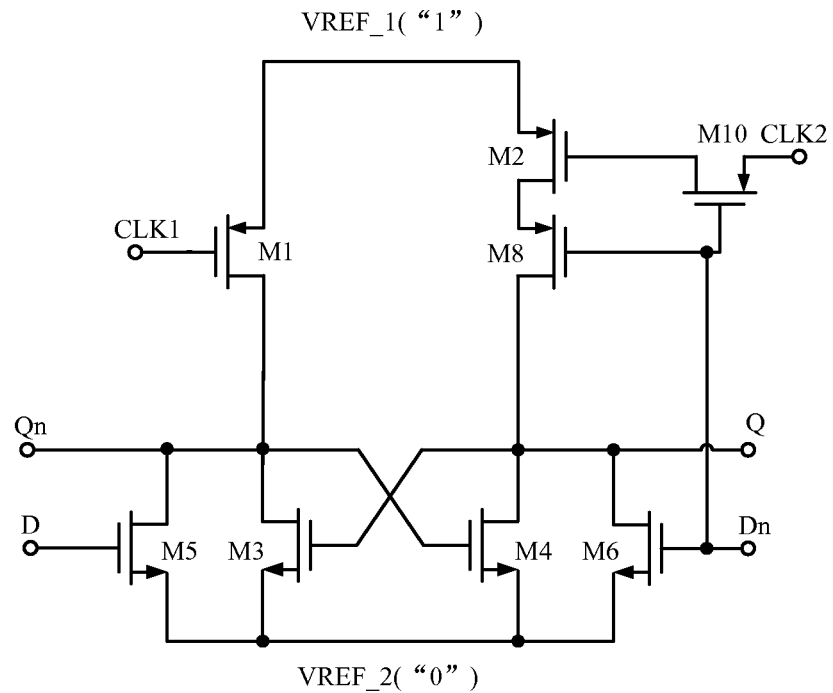

Referring to FIG. 17, a circuit diagram of a latch is illustrated according to another embodiment of the present disclosure.

As shown in FIG. 17, the second transistor M2 is a PMOS transistor, a source of the second transistor M2 is coupled to the power supply VREF_1, a gate of the second transistor M2 is coupled to a drain of the tenth transistor M10, and a drain of the second transistor M2 is coupled to a source of the eighth transistor M8.

The eighth transistor M8 is a PMOS transistor, a gate of the eighth transistor M8 serves as the third feedforward control terminal of the second feedforward control unit and is coupled to the second input terminal Dn, and a drain of the eighth transistor M8 serves as the fourth output terminal.

The tenth transistor M10 is a PMOS transistor, a source of the tenth transistor M10 serves as the second clock signal input terminal CLK2, and a gate of the tenth transistor M10 serves as the fourth feedforward control terminal of the second feedforward control unit and is coupled to the second input terminal Dn.

When a high-level signal is input into the second input terminal Dn and a low-level signal is input into the first input terminal D, the eighth transistor M8 is turned off thus a current path from the second logic unit to the power supply VREF_1 and the ground wire VREF_2 is cut off. Therefore, the DC power consumption of the latch can be reduced.

Figure 18:
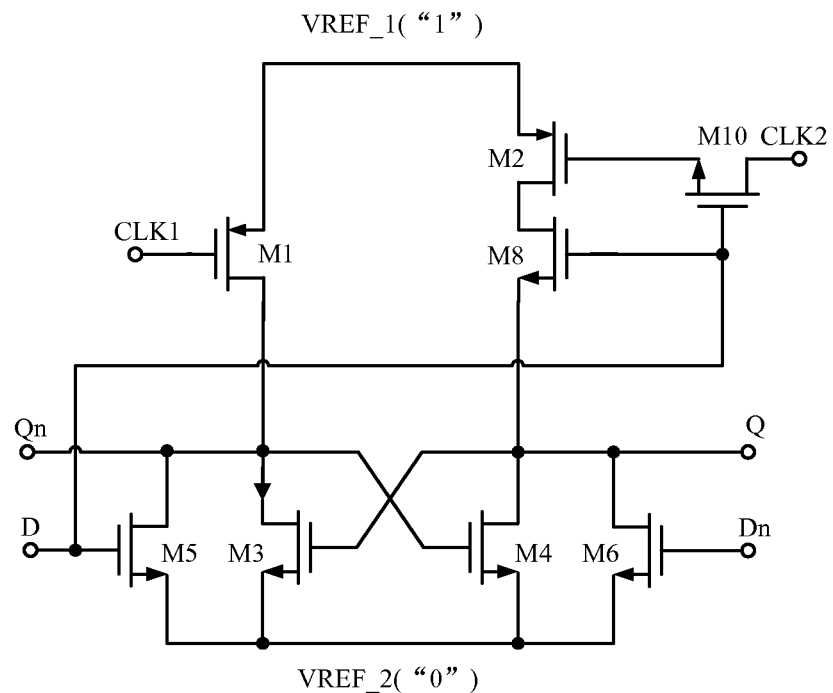

Referring to FIG. 18, a circuit diagram of a latch is illustrated according to another embodiment of the present disclosure.

As shown in FIG. 18, the second transistor M2 is a PMOS transistor, a source of the second transistor M2 is coupled to the power supply VREF_1, a gate of the second transistor M2 is coupled to a source of the tenth transistor M10, and a drain of the second transistor M2 is coupled to a drain of the eighth transistor M8.

The eighth transistor M8 is a NMOS transistor, a gate of the eighth transistor M8 serves as the third feedforward control terminal, and a source of the eighth transistor M8 serves as the fourth output terminal.

The tenth transistor M10 is a NMOS transistor, a gate of the tenth transistor M10 serves as the fourth feedforward control terminal, a drain of the tenth transistor M10 serves as the second clock signal input terminal CLK2, and both the third feedforward control terminal and the fourth feedforward control terminal are coupled to the first input terminal D.

When a high-level signal is input into the second input terminal Dn and a low-level signal is input into the first input terminal D, the second transistor M2 and the tenth transistor M10 are turned off. Correspondingly, a current path from the second transistor M2 to the eighth transistor M8 and the tenth transistor M10 is cut off, thus a current path from the second logic unit to the power supply VREF_1 and the ground wire VREF_2 is cut off. Therefore, the DC power consumption of the latch can be reduced.

Figure 19:
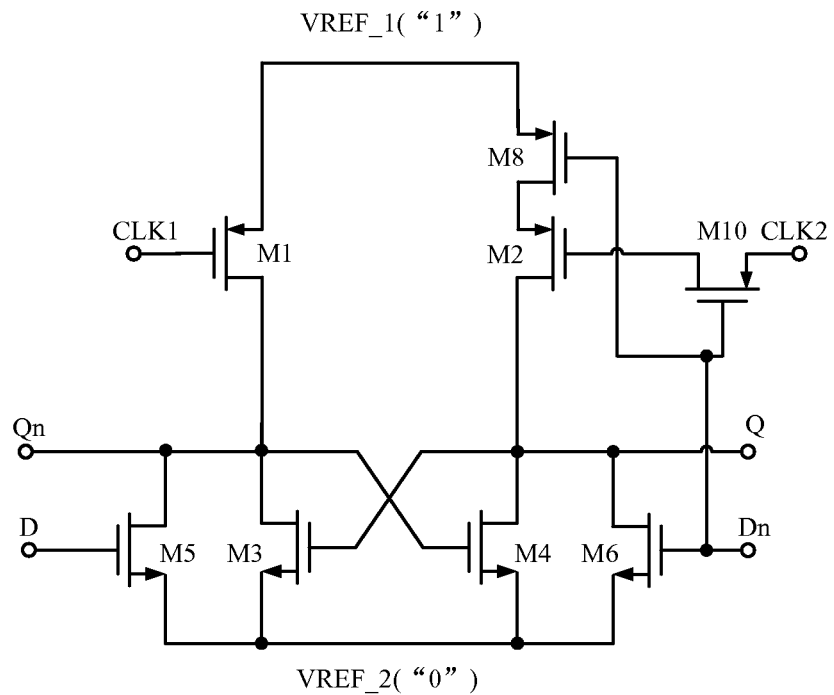

Referring to FIG. 19, a circuit diagram of a latch is illustrated according to another embodiment of the present disclosure.

As shown in FIG. 19, the second transistor M2 is a PMOS transistor, a source of the second transistor M2 is coupled to a drain of the eighth transistor M8, a gate of the second transistor M2 is coupled to a drain of the tenth transistor M10, and a drain of the second transistor M2 serves as the fourth output terminal.

The eighth transistor M8 is a PMOS transistor, a gate of the eighth transistor M8 serves as the third feedforward control terminal of the second feedforward control terminal and is coupled to the second input terminal Dn, and a source of the eighth transistor M8 is coupled to the power supply VREF_1.

The tenth transistor M10 is a PMOS transistor, a gate of the tenth transistor M10 serves as the fourth feedforward control terminal and is coupled to the second input terminal Dn, and a source of the tenth transistor M10 serves as the second clock signal input terminal CLK2.

When a high-level signal is input into the second input terminal Dn and a low-level signal is input into the first input terminal D, the eighth transistor M8 and the tenth transistor M10 are turned off, thus a current path from the second logic unit to the power supply VREF_1 and the ground wire VREF_2 is cut off. Therefore, the DC power consumption of the latch can be reduced.

Figure 20:
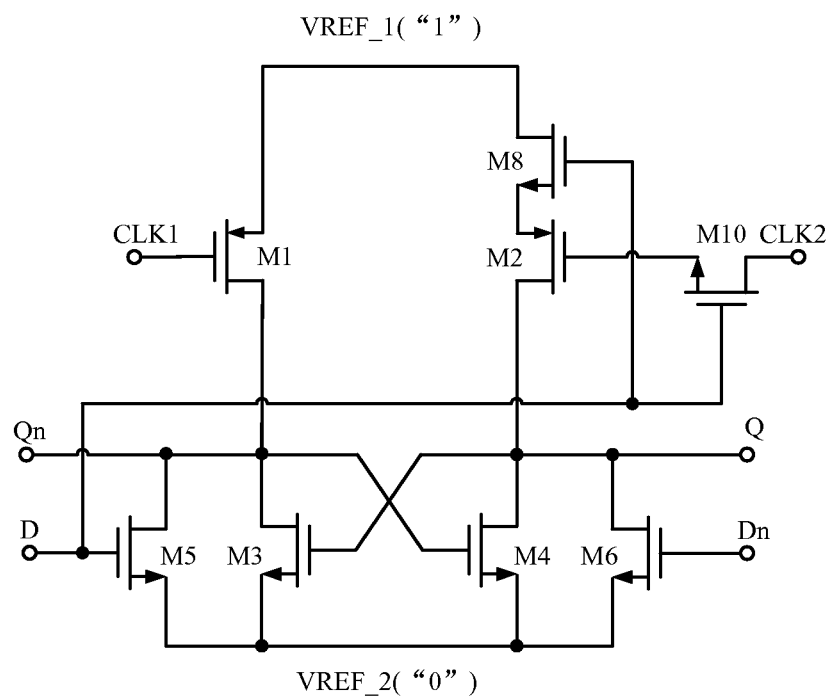

Referring to FIG. 20, a circuit diagram of a latch is illustrated according to another embodiment of the present disclosure. The second transistor M2 is a PMOS transistor, a source of the second transistor M2 is coupled to a source of the eighth transistor M8, a gate of the second transistor M2 is coupled to a source of the tenth transistor M10, and a drain of second transistor M2 serves as the fourth output terminal.

The eighth transistor M8 is a NMOS transistor, a gate of the eighth transistor M8 serves as the third feedforward control terminal of the second feedforward control unit and is coupled to the first input terminal D, and a drain of the eighth transistor M8 is coupled to the power supply VREF_1.

The tenth transistor M10 is a NMOS transistor, a gate of the tenth transistor M10 serves as the fourth feedforward control terminal of the second feedforward control unit and is coupled to the first input terminal D, and a drain of the tenth transistor M10 serves as the second clock signal input terminal CLK2.

When a high-level signal is input into the first input terminal D and a low-level signal is input into the second input terminal Dn, the eighth transistor M8 is turned off. Correspondingly, a current path from the second transistor M2 to the eighth transistor M8 and the tenth transistor M10 is cut off, thus a current path from the second logic unit to the power supply VREF_1 and the ground wire VREF_2 is cut off. Therefore, the DC power consumption of the latch can be reduced.

It can been seen from above embodiments, the first feedforward control unit may have a same circuit configuration as the second feedforward control unit, or the circuit configuration of the first feedforward control unit is different from the circuit configuration of the second feedforward control unit. In above embodiments, a latch having only a first feedforward control unit or only a second feedforward control unit is described. Further, a latch having both a first feedforward control unit and a second feedforward control unit will be described below.

Figure 21:
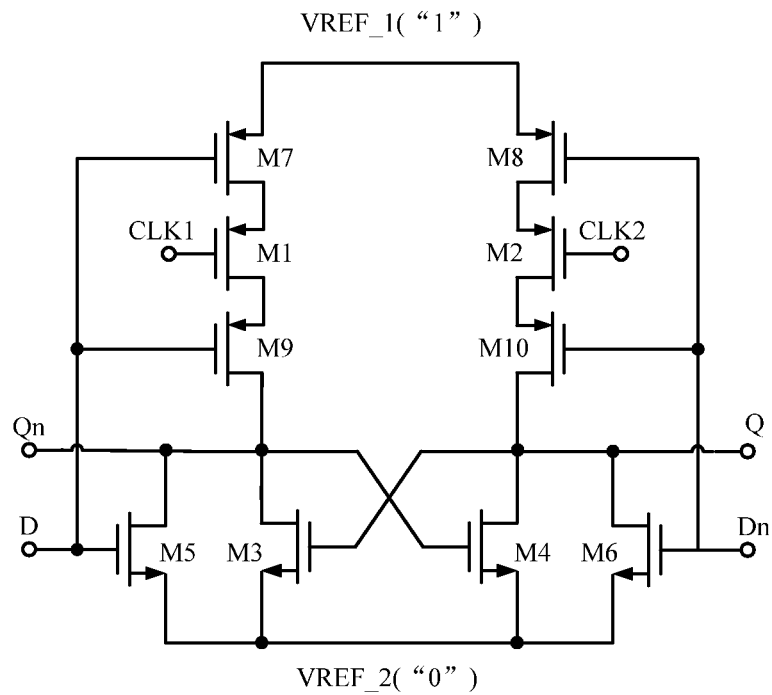

Referring to FIG. 21, the first feedforward control unit is similar to the first feedforward control unit shown in FIG. 4, and the second feedforward control unit is similar to the second feedforward control unit shown in FIG. 13.

The first transistor M1 is a PMOS transistor, a source of the first transistor M1 is coupled to a drain of the seventh transistor M7, a drain of the first transistor M1 is coupled to a source of the ninth transistor M9, and a gate of the first transistor M1 serves as the first clock signal input terminal CLK1 of the first feedforward control unit to receive the first clock signal.

The seventh transistor M7 is a PMOS transistor, a source of the seventh transistor M7 is coupled to the power supply VREF_1, and a gate of the seventh transistor M7 serves as the first feedforward control terminal of the first feedforward control unit and is coupled to the first input terminal D.

The ninth transistor M9 is a PMOS transistor, a gate of the ninth transistor M9 serves as the second feedforward control terminal of the first feedforward control unit and is coupled to the first input terminal D, and a drain of the ninth transistor M9 serves as the third output terminal.

The second transistor M2 is a PMOS transistor, a source of the second transistor M2 is coupled to a drain of the eighth transistor M8, a drain of the second transistor M2 is coupled to a source of the eighth transistor M10, and a gate of the second transistor M2 serves as the second clock signal input terminal CLK2 of the second feedforward control unit to receive the second clock signal.

The eighth transistor M8 is a PMOS transistor, a source of the eighth transistor M8 is coupled to the power supply VREF_1, and a gate of the eighth transistor M8 serves as the third feedforward control terminal of the second feedforward control unit and is coupled to the second input terminal Dn.

The tenth transistor M10 is a PMOS transistor, a gate of the tenth transistor M10 serves as the fourth feedforward control terminal of the second feedforward control unit and is coupled to the second input terminal Dn, and a drain of the tenth transistor M10 serves as the fourth output terminal.

When a high-level signal is input into the first input terminal D and a low-level signal is input into the second input terminal Dn, the seventh transistor M7 and the ninth transistor M9 are turned off, a current path from the first transistor M1 to the seventh transistor M7 and the ninth transistor M9 is cut off correspondingly, and the fourth transistor M4 and the sixth transistor M4 are turned off.

That is, a current path from the first logic unit to the power supply VREF_1 and the ground wire VREF_2 is cut off, and a current path from the second logic unit to the power supply VREF_1 and the ground wire VREF_2 is also cut off. The power supply VREF_1 charges the second output terminal Q of the latch through the second transistor M2, the eighth transistor M8 and the tenth transistor M10, and the first output terminal Qn is discharged to the ground wire VREF_2 through the third transistor M3 and the fifth transistor M5. Compared to the latches provided in above embodiments, the latch in FIG. 22 can further reduce the DC power consumption. After the first output terminal Qn is discharged and the second output terminal Q is charged, a dynamic alternating current (AC) of an alternating current path is eliminated. Therefore, the AC power consumption of the latch can be reduced.

When a low-level signal is input into the first input terminal D and a high-level signal is input into the second input terminal Dn, the eighth transistor M8 and the tenth transistor M10 are turned off, a current path from the second transistor M2 to the eighth transistor M8 and the tenth transistor M10 is cut off correspondingly, and the third transistor M3 and the fifth transistor M5 are turned off.

That is, the current path from the second logic unit to the power supply VREF_1 and the ground wire VREF_2 is cut off, and the current path from the first logic unit to the power supply VREF_1 and the ground wire VREF_2 is also cut off. The power supply VREF_1 charges the first output terminal Qn of the latch through the first transistor M1, the seventh transistor M7 and the ninth transistor M9, and the second output terminal Q is discharged to the ground wire VREF_2 through the fourth transistor M4 and the sixth transistor M6. Compared to the latches provided in above embodiments, the latch in FIG. 22 can further reduce the DC power consumption. After the first output terminal Qn is charged and the second output terminal Q is discharged, a dynamic alternating current of an alternating current path is eliminated. Therefore, the AC power consumption of the latch can be reduced.

Figure 22:
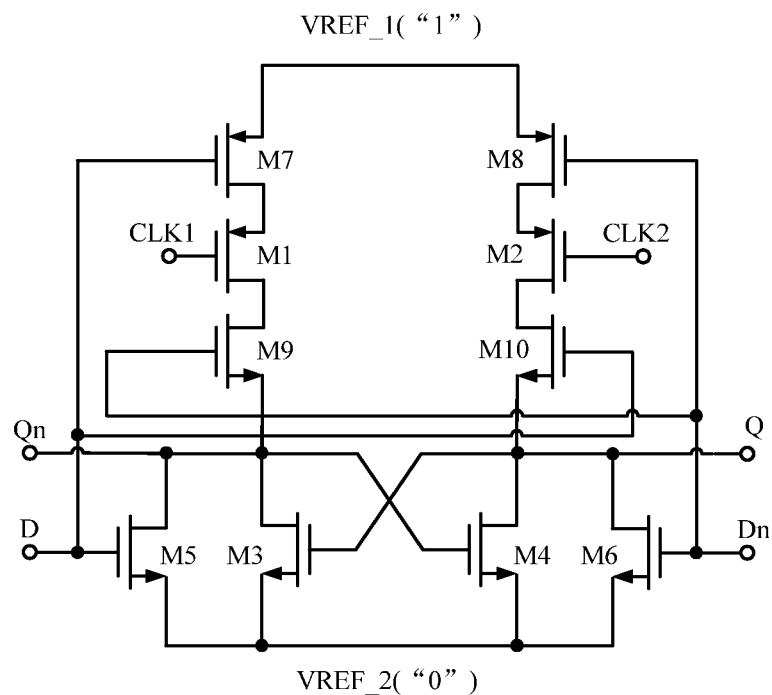

Referring to FIG. 22, the first feedforward control unit is similar to the first feedforward control unit shown in FIG. 6, and the second feedforward control unit is similar to the second feedforward control unit shown in FIG. 15.

The first transistor M1 is a PMOS transistor, a source of the first transistor M1 is coupled to a drain of the seventh transistor M7, a drain of the first transistor M1 is coupled to a drain of the ninth transistor M9, and a gate of the first transistor M1 serves as the first clock signal input terminal CLK1 of the first feedforward control unit to receive the first clock signal.

The seventh transistor M7 is a PMOS transistor, a source of the seventh transistor M7 is coupled to the power supply VREF_1, and a gate of the seventh transistor M7 serves as the first feedforward control terminal of the first feedforward control unit and is coupled to the first input terminal D.

The ninth transistor M9 is a NMOS transistor, a gate of the ninth transistor M9 serves as the second feedforward control terminal of the first feedforward control unit and is coupled to the second input terminal Dn, and a source of the ninth transistor M9 serves as the third output terminal.

As shown in FIG. 15, the second transistor M2 is a PMOS transistor, a source of the second transistor M2 is coupled to a drain of the eighth transistor M8, a drain of the second transistor M2 is coupled to a drain of the tenth transistor M10, and a gate of the second transistor M2 serves as the second clock signal input terminal CLK2 of the second feedforward control unit to receive the second clock signal.

The eighth transistor M8 is a PMOS transistor, a source of the eighth transistor M8 is coupled to the power supply VREF_1, and a gate of the eighth transistor M8 serves as the third feedforward control terminal of the second feedforward control unit and is coupled to the second input terminal Dn.

The tenth transistor M10 is a NMOS transistor, a gate of the tenth transistor M10 serves as the fourth feedforward control terminal of the second feedforward control unit and is coupled to the first input terminal D, and a source of the tenth transistor M10 serves as the fourth output terminal.

Similarly, when differential signals are input into the first input terminal D and the second input terminal Dn, a current path from the first logic unit to the power supply VREF_1 and the ground wire VREF_2 is cut off, and a current path from the second logic unit to the power supply VREF_1 and the ground wire VREF_2 is also cut off. Therefore, the DC power consumption of the latch can be reduced effectively.

The first output terminal Qn is in a charging or discharging state, and the second output terminal Q is also in a discharging or charging state. When the first output terminal Qn is charged, the second output terminal Q is discharged, or when the first output terminal Qn is discharged, the second output terminal Q is charged. After the first output terminal Qn and the second output terminal Q is charged or discharged, the dynamic alternating current in the latch is eliminated. Therefore, the AC power consumption of the latch can be reduced.

Figure 23:
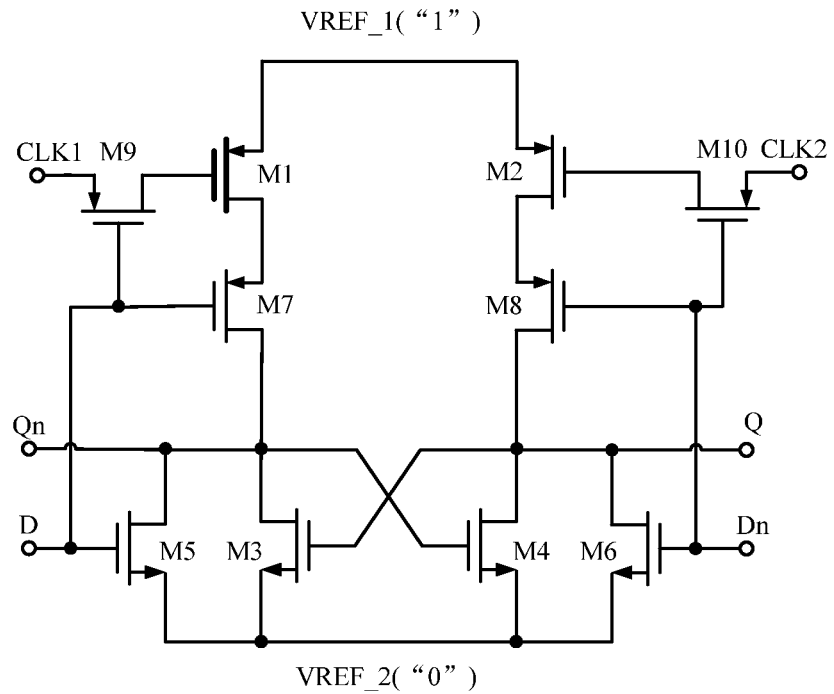
Figure 24:
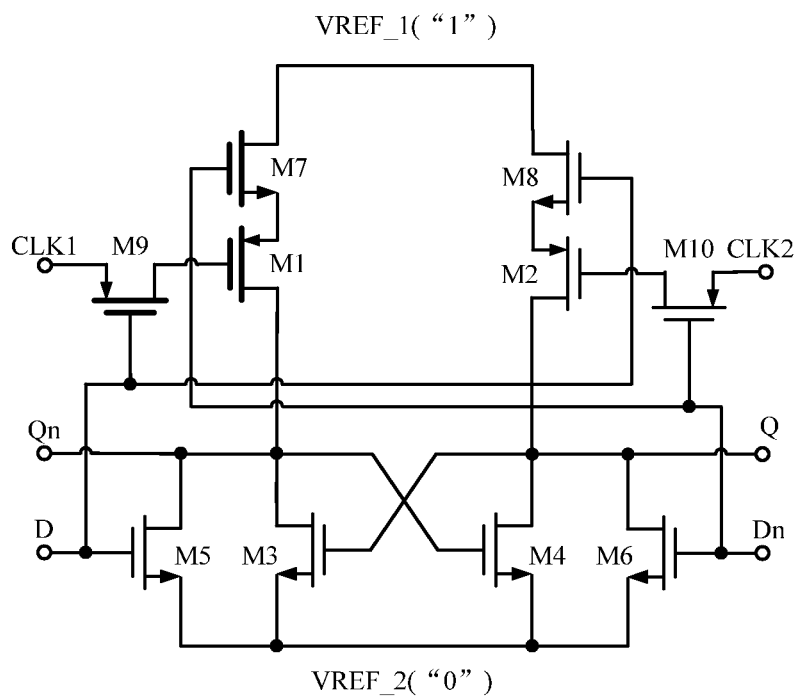

Referring to FIG. 23, the first feedforward control unit is similar to the first feedforward control unit shown in FIG. 8, and the second feedforward control unit is similar to the second feedforward control unit shown in FIG. 17.

The first transistor M1 is a PMOS transistor, a source of the first transistor M1 is coupled to the power supply VREF_1, a gate of the first transistor M1 is coupled to a drain of the ninth transistor M9, and a drain of the first transistor M1 is coupled to a source of the seventh transistor M7.

The seventh transistor M7 is a PMOS transistor, a gate of the seventh transistor M7 serves as the first feedforward control terminal of the first feedforward control unit and is coupled to the first input terminal D, a drain of the seventh transistor M7 serves as the third output terminal.

The ninth transistor M9 is a PMOS transistor, a source of the ninth transistor M9 serves as the first clock signal input terminal CLK1, and a gate of the ninth transistor M9 serves as the second feedforward control terminal of the first feedforward control unit and is coupled to the first input terminal D.

The second transistor M2 is a PMOS transistor, a source of the second transistor M2 is coupled to the power supply VREF_1, a gate of the second transistor M2 is coupled to a drain of the tenth transistor M10, and a drain of the second transistor M2 is coupled to a source of the eighth transistor M8.

The eighth transistor M8 is a PMOS transistor, a gate of the eighth transistor M8 serves as the third feedforward control terminal of the second feedforward control unit and is coupled to the second input terminal Dn, and a drain of the eighth transistor M8 serves as the fourth output terminal.

The tenth transistor M10 is a PMOS transistor, a source of the tenth transistor M10 serves as the second clock signal input terminal CLK2, and a gate of the tenth transistor M10 serves as the fourth feedforward control terminal of the second feedforward control unit and is coupled to the second input terminal Dn.

When differential signals are input into the first input terminal D and the second input terminal Dn, a current path from the first logic unit to the power supply VREF_1 and the ground wire VREF_2 is cut off, and a current path from the second logic unit to the power supply VREF_1 and the ground wire VREF_2 is also cut off. Therefore, the DC power consumption of the latch can be reduced effectively.

The first output terminal Qn is in a charging or discharging state, and the second output terminal Q is in a discharging or charging state. When the first output terminal Qn is charged, the second output terminal Q is discharged, or when the first output terminal Qn is discharged, the second output terminal Q is charged. After the first output terminal Qn and the second output terminal Q is charged or discharged, the dynamic alternating current in the latch is eliminated. Therefore, the AC power consumption of the latch can be reduced.

It should be understood that, in other embodiments, the first feedforward control unit and the second feedforward control unit can be connected with the input terminals in a different way.

When the latch includes both the first feedforward control unit and the second feedforward control unit, the circuit configuration of the first feedforward control unit may be different from the circuit configuration of the second feedforward control unit. For example, the first feedforward control unit is similar to the first feedforward control unit shown in FIG. 5, but the second feedforward control unit is similar to the second feedforward control unit shown in FIG. 18. In practical applications, circuit configurations of the first feedforward control unit and the second feedforward control unit can be determined according to actual needs.

Referring to FIG. 14, a circuit diagram of a latch is illustrated according to another embodiment of the present disclosure.

The first transistor M1 is a PMOS transistor, a source of the first transistor M1 is coupled to a source of the seventh transistor M7, a gate of the first transistor M1 is coupled to a drain of the ninth transistor M9, and a drain of the first transistor M1 serves as the third output terminal.

The seventh transistor M7 is a NMOS transistor, a gate of the seventh transistor M7 serves as the first feedforward control terminal of the first feedforward control unit and is coupled to the second input terminal Dn, a drain of the seventh transistor M7 is coupled to the power supply VREF_1.

The ninth transistor M9 is a PMOS transistor, a gate of the ninth transistor M9 serves as the first feedforward control terminal of the first feedforward control unit and is coupled to the first input terminal D, and a source of the ninth transistor M9 serves as the first clock signal input terminal CLK1.

The second transistor M2 is a PMOS transistor, a source of the second transistor M2 is coupled to a source of the eighth transistor M8, a gate of the second transistor M2 is coupled to a drain of the tenth transistor M10, and a drain of the second transistor M2 serves as the fourth output terminal.

The eighth transistor M8 is a NMOS transistor, a gate of the eighth transistor M8 serves as the third feedforward control terminal of the second feedforward control unit and is coupled to the first input terminal D, and a drain of the eighth transistor M8 is coupled to the power supply VREF_1.

The tenth transistor M10 is a PMOS transistor, a gate of the tenth transistor M10 serves as the fourth feedforward control terminal of the second feedforward control unit and is coupled to the second input terminal Dn, and a source of the tenth transistor M10 serves as the second signal input terminal CLK2.

Similarly, when differential signals are input into the first input terminal D and the second input terminal Dn, a current path from the first logic unit to the power supply VREF_1 and the ground wire VREF_2 is cut off, and a current path from the second logic unit to the power supply VREF_1 and the ground wire VREF_2 is also cut off. Therefore, the DC power consumption of the latch can be reduced effectively.

The first output terminal Qn is in a charging or discharging state, and the second output terminal Q is in a discharging or charging state. When the first output terminal Qn is charged, the second output terminal Q is discharged, or when the first output terminal Qn is discharged, the second output terminal Q is charged. After the first output terminal Qn and the second output terminal Q is charged or discharged, the dynamic alternating current in the latch is eliminated. Therefore, the AC power consumption of the latch can be reduced.

In other embodiments of the present disclosure, circuit configurations of the first feedforward control unit and the second feedforward control unit are not limited the circuit configurations provided in above embodiments, as long as the current path between the power supply and the ground wire is cut off.

Although the present disclosure has been disclosed above with reference to preferred embodiments thereof, it should be understood by those skilled in the art that various changes may be made without departing from the spirit or scope of the disclosure. Accordingly, the present disclosure is not limited to the embodiments disclosed.

What is claimed is:
1. A latch, comprising:
 a first logic unit coupled between a power supply and a ground wire, wherein the first logic unit comprises a first input terminal and a first output terminal;

a second logic unit having a structure symmetrical to that of the first logic unit, wherein the second logic unit comprises a second input terminal and a second output terminal; and a first feedforward control unit adapted for cutting off a first current path between the power supply and the ground wire, wherein the first feedforward control unit comprises a first clock signal input terminal adapted for receiving a first clock signal, a third output terminal coupled to the first output terminal, and at least two feedforward control terminals, at least one of which is coupled to the first input terminal or the second input terminal.

2. The latch according to claim 1, further comprising: a second feedforward control unit adapted for cutting off a second current path between the power supply and the ground wire, where the second current path is different from the first current path, wherein the second feedforward control unit comprises:
a second clock signal input terminal adapted for receiving a second clock signal;
a fourth output terminal coupled to the second output terminal; and
at least two feedforward control terminals, at least one of which is coupled to the second input terminal or the first input terminal.

3. The latch according to claim 2, wherein the first logic unit comprises a third transistor and a fifth transistor, and the second logic unit comprises a fourth transistor and a sixth transistor, wherein for the third transistor, a drain is coupled to the first output terminal, a source is coupled to the ground wire, and a gate is coupled to the second output terminal;

for the fifth transistor, a drain is coupled to the first output terminal, a source is coupled to the ground wire, and a gate is coupled to the first input terminal;

for the fourth transistor, a drain is coupled to the second output terminal, a source is coupled to the ground wire, and a gate is coupled to the first output terminal; and for the sixth transistor, a drain is coupled to the second output terminal, a source is coupled to the ground wire, and a gate is coupled to the second input terminal.

4. The latch according to claim 3, wherein the first feedforward control unit comprises a first feedforward control terminal, a second feedforward control terminal, a first transistor, a seventh transistor and a ninth transistor, and the first transistor is coupled to the seventh transistor and the ninth transistor.

5. The latch according to claim 4, wherein the first transistor is a PMOS transistor, a source of the first transistor is coupled to a drain of the seventh transistor, a drain of the first transistor is coupled a source of the ninth transistor, and a gate of the first transistor serves as the first clock signal input terminal;

the seventh transistor is a PMOS transistor, a source of the seventh transistor is coupled to the power supply, and a gate of the seventh transistor serves as the first feedforward control terminal; and the ninth transistor is a PMOS transistor, a gate of the ninth transistor serves as the second feedforward control terminal, a drain of the ninth transistor serves as the third output terminal, and both the first feedforward control terminal and the second feedforward control terminal are coupled to the first input terminal.

6. The latch according to claim 4, wherein the first transistor is a PMOS transistor, a source of the first transistor is coupled to a source of the seventh transistor, a drain of the first transistor is coupled to a drain of the ninth transistor, and a gate of the first transistor serves as the first clock signal input terminal;

the seventh transistor is a NMOS transistor, a drain of the seventh transistor is coupled to the power supply, and a gate of the seventh transistor serves as the first feedforward control terminal; and the ninth transistor is a NMOS transistor, a gate of the ninth transistor serves as the second feedforward control terminal, a source of the ninth transistor M9 serves as the third output terminal, and both the first feedforward control terminal and the second feedforward control terminal are coupled to the second input terminal.

7. The latch according to claim 4, wherein the first transistor is a PMOS transistor, a source of the first transistor is coupled to a drain of the seventh transistor, a drain of the first transistor is coupled to a drain of the ninth transistor, and a gate of the first transistor serves as the first clock signal input terminal;

the seventh transistor is a PMOS transistor, a source of the seventh transistor is coupled to the power supply, a gate of the seventh transistor serves as the first feedforward control terminal, and the first feedforward control terminal is coupled to the first input terminal; and the ninth transistor is a NMOS transistor, a gate of the ninth transistor serves as the second feedforward control terminal, a source of the ninth transistor serves as the third output terminal, and the second feedforward control terminal is coupled to the second input terminal.

8. The latch according to claim 4, wherein the first transistor is a PMOS transistor, a source of the first transistor is coupled to a source of the seventh transistor, a drain of the first transistor is coupled to a source of the ninth transistor, and a gate of the first transistor serves as the first clock signal input terminal;

the seventh transistor is a NMOS transistor, a drain of the seventh transistor is coupled to the power supply, a gate of the seventh transistor serves as the first feedforward control terminal, and the first feedforward control terminal is coupled to the second input terminal; and the ninth transistor is a PMOS transistor, a drain of the ninth transistor serves as the third output terminal, a gate of the ninth transistor serves as the second feedforward control terminal, and the second feedforward control terminal is coupled to the first input terminal.

9. The latch according to claim 4, wherein the first transistor is a PMOS transistor, a source of the first transistor is coupled to the power supply, a gate of the first transistor is coupled to a drain of the ninth transistor, and a drain of the first transistor is coupled to a source of the seventh transistor;

the seventh transistor is a PMOS transistor, a gate of the seventh transistor serves as the first feedforward control terminal, and a drain of the seventh transistor serves as the third output terminal; and the ninth transistor is a PMOS transistor, a gate of the ninth transistor serves as the second feedforward control terminal, a source of the ninth transistor serves as the first clock signal input terminal, and both the first feedforward control terminal the second feedforward control terminal are coupled to the first input terminal.

10. The latch according to claim 4, wherein the first transistor is a PMOS transistor, a source of the first transistor is coupled to the power supply, a gate of the first transistor is coupled to a source of the ninth transistor, and a drain of the first transistor is coupled to a drain of the seventh transistor;

the seventh transistor is a NMOS transistor, a gate of the seventh transistor serves as the first feedforward control terminal, and a source of the seventh transistor serves as the third output terminal; and the ninth transistor is a NMOS transistor, a gate of the ninth transistor serves as the second feedforward control terminal, a drain of the ninth transistor serves as the first clock signal input terminal, and both the first feedforward control terminal and the second feedforward control terminal are coupled to the second input terminal.

11. The latch according to claim 4, wherein the first transistor is a PMOS transistor, a source of the first transistor is coupled to a source of the seventh transistor, a gate of the first transistor is coupled to a source of the ninth transistor, and a drain of the first transistor serves as the third output terminal;

the seventh transistor is a NMOS transistor, a gate of the seventh transistor serves as the first feedforward control terminal, and a drain of the seventh transistor is coupled to the power supply; and the ninth transistor is a NMOS transistor, a gate of the ninth transistor serves as the second feedforward control terminal, a drain of the ninth transistor serves as the first clock signal input terminal, both the first feedforward control terminal and the second feedforward control terminal are coupled to the second input terminal.

12. The latch according to claim 4, wherein the first transistor is a PMOS transistor, a source of the first transistor is coupled to a drain of the seventh transistor, a gate of the first transistor is coupled to a drain of the ninth transistor, and a drain of the first transistor serves as the third output terminal;

the seventh transistor is a PMOS transistor, a gate of the seventh transistor serves as the first feedforward control terminal, and a source of the seventh transistor is coupled to the power supply; and the ninth transistor is a PMOS transistor, a gate of the ninth transistor serves as the second feedforward control terminal, a source of the ninth transistor serves as the first clock signal input terminal, and both the first feedforward control terminal and the second feedforward control terminal are coupled to the first input terminal.

13. The latch according to claim 4, wherein the first transistor is a PMOS transistor, a source of the first transistor is coupled to the power supply, a gate of the first transistor is coupled to a drain of the ninth transistor, and a drain of the first transistor is coupled to a source of the seventh transistor;

the seventh transistor is a PMOS transistor, a gate of the seventh transistor serves as the first feedforward control terminal and is coupled to a low-level signal, and a drain of the seventh transistor serves as the third output terminal; and the ninth transistor is a PMOS transistor, a source of the ninth transistor serves as the first clock signal input terminal, and a gate of the ninth transistor serves as the second feedforward control terminal and is coupled to the first input terminal.

14. The latch according to claim 3, wherein the second feedforward control unit comprises a third feedforward control terminal, a fourth feedforward control terminal, a second transistor, an eighth transistor and a tenth transistor, and the second transistor is coupled to the eighth transistor and the tenth transistor.

15. The latch according to claim 14, wherein the second transistor is a PMOS transistor, a source of the second transistor is coupled to a drain of the eighth transistor, a drain of the second transistor is coupled to a source of the tenth transistor, and a gate of the second transistor serves as the second clock signal input terminal;

the eighth transistor is a PMOS transistor, a source of the eighth transistor is coupled to the power supply, and a gate of the eighth transistor serves as the third feedforward control terminal; and the tenth transistor is a PMOS transistor, a gate of the tenth transistor serves as the fourth feedforward control terminal, a drain of the tenth transistor serves as the fourth output terminal, and both the third feedforward control terminal and the fourth output terminal are coupled to the second input terminal.

16. The latch according to claim 14, wherein the second transistor is a PMOS transistor, a source of the second transistor is coupled to a source of the eighth transistor, a drain of the second transistor is coupled to a drain of the tenth transistor, and a gate of the second transistor serves as the second clock signal input terminal;

the eighth transistor M8 is a NMOS transistor, a drain of the eighth transistor is coupled to the power supply, and a gate of the eighth transistor serves as the third feedforward control terminal; and the tenth transistor is a NMOS transistor, a gate of the tenth transistor serves as the fourth feedforward control terminal, a source of the tenth transistor serves as the fourth output terminal, and both the third feedforward control terminal and the fourth output terminal are coupled to the first input terminal.

17. The latch according to claim 14, wherein the second transistor is a PMOS transistor, a source of the second transistor is coupled to a drain of the eighth transistor, a drain of the second transistor is coupled to a drain of the tenth transistor, and a gate of the second transistor serves as the second clock signal input terminal;

the eighth transistor is a PMOS transistor, a source of the eighth transistor is coupled to the power supply, a gate of the eighth transistor serves as the third feedforward control terminal, and the third feedforward control terminal is coupled to the second input terminal; and the tenth transistor is a NMOS transistor, a gate of the tenth transistor serves as the fourth feedforward control terminal, a source of the tenth transistor serves as the fourth output terminal, and the fourth feedforward control terminal is coupled to the first input terminal.

18. The latch according to claim 14, wherein the second transistor is a PMOS transistor, a source of the second transistor is coupled to a source of the eighth transistor, a drain of the second transistor is coupled to a source of the tenth transistor, and a gate of the second transistor serves as the second clock signal input terminal;

the eighth transistor is a NMOS transistor, a drain of the eighth transistor is coupled to the power supply, a gate of the eighth transistor serves as the third feedforward control terminal, and the third feedforward control terminal is coupled to the first input terminal; and the tenth transistor is a PMOS transistor, a gate of the tenth transistor serves as the fourth feedforward control terminal, a drain of the tenth transistor serves as the fourth output terminal, and the fourth feedforward control terminal is coupled to the second input terminal.

19. The latch according to claim 14, wherein the second transistor is a PMOS transistor, a source of the second transistor is coupled to the power supply, a gate of the second transistor is coupled to a drain of the tenth transistor, and a drain of the second transistor is coupled to a source of the eighth transistor;
the eighth transistor is a PMOS transistor, a gate of the eighth transistor serves as the third feedforward control terminal, and a drain of the eighth transistor serves as the fourth output terminal; and
the tenth transistor is a PMOS transistor, a gate of the tenth transistor serves as the fourth feedforward control terminal, a source of the tenth transistor serves as the second clock signal input terminal, and both the third feedfoward control terminal and the fourth output terminal are coupled to the second input terminal.

20. The latch according to claim 14, wherein the second transistor is a PMOS transistor, a source of the second transistor is coupled to the power supply, a gate of the second transistor is coupled to a source of the tenth transistor, and a drain of the second transistor is coupled to a drain of the eighth transistor;
the eighth transistor is a NMOS transistor, a gate of the eighth transistor serves as the third feedforward control terminal, and a source of the eighth transistor serves as the fourth output terminal; and
the tenth transistor is a NMOS transistor, a gate of the tenth transistor serves as the fourth feedforward control terminal, a drain of the tenth transistor serves as the second clock signal input terminal, and both the third feedforward control terminal and the fourth feedforward control terminal are coupled to the first input terminal.

21. The latch according to claim 14, wherein the second transistor is a PMOS transistor, a source of the second transistor is coupled to a source of the eighth transistor, a gate of the second transistor is coupled to a source of the tenth transistor, and a drain of second transistor serves as the fourth output terminal;
the eighth transistor is a NMOS transistor, a gate of the eighth transistor serves as the third feedforward control terminal, and a drain of the eighth transistor is coupled to the power supply; and
the tenth transistor is a NMOS transistor, a gate of the tenth transistor serves as the fourth feedforward control terminal, a drain of the tenth transistor serves as the second clock signal input terminal, and both the third feedforward control terminal and the fourth feedforward control terminal are coupled to the first input terminal.

22. The latch according to claim 14, wherein the second transistor is a PMOS transistor, a source of the second transistor is coupled to a drain of the eighth transistor, a gate of the second transistor is coupled to a drain of the tenth transistor, and a drain of the second transistor serves as the fourth output terminal;
the eighth transistor is a PMOS transistor, a gate of the eighth transistor serves as the third feedforward control terminal, and a source of the eighth transistor is coupled to the power supply; and
the tenth transistor is a PMOS transistor, a gate of the tenth transistor serves as the fourth feedforward control terminal, a source of the tenth transistor serves as the second clock signal input terminal, and both the third feedforward control terminal and the fourth feedforward control terminal are coupled to the second input terminal.

23. The latch according to claim 2, wherein at least one feedforward control terminal of the first feedforward control unit is coupled to the first input terminal, other feedforward control terminals of the first feedforward control unit are coupled to the ground wire, at least one feedforward control terminal of the second feedforward control unit is coupled to the second input terminal, and other feedforward control terminals of the second feedforward control unit are coupled to the ground wire;
or, at least one feedforward control terminal of the first feedforward control unit is coupled to the second input terminal, other feedforward control terminals of the first feedforward control unit are coupled to the ground wire, at least one feedforward control terminal of the second feedforward control unit is coupled to the first input terminal, and other feedforward control terminals of the second feedforward control unit are coupled to the ground wire.

24. A frequency divider, comprising: at least two of the latches according to claim 1, wherein the at least two of the latches comprises a first latch and a second latch, and the first input terminal and the second input terminal of the first latch are respectively coupled to the first output terminal and the second output terminal of the second latch.

* * * * *